United States Patent
Lai et al.

(10) Patent No.: US 7,405,158 B2
(45) Date of Patent: Jul. 29, 2008

(54) METHODS FOR DEPOSITING TUNGSTEN LAYERS EMPLOYING ATOMIC LAYER DEPOSITION TECHNIQUES

(75) Inventors: Ken Kaung Lai, Milpitas, CA (US); Ravi Rajagopalan, Sunnyvale, CA (US); Amit Khandelwal, Santa Clara, CA (US); Madhu Moorthy, Santa Clara, CA (US); Srinivas Gandikota, Santa Clara, CA (US); Joseph Castro, Fremont, CA (US); Averginos V. Gelatos, Redwood City, CA (US); Cheryl Knepfler, Fremont, CA (US); Ping Jian, San Jose, CA (US); Hongbin Fang, Mountain View, CA (US); Chao-Ming Huang, Hsin Chu (TW); Ming Xi, Palo Alto, CA (US); Michael X. Yang, Palo Alto, CA (US); Hua Chung, San Jose, CA (US); Jeong Soo Byun, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 11/038,592

(22) Filed: Jan. 19, 2005

(65) Prior Publication Data

US 2006/0009034 A1    Jan. 12, 2006

Related U.S. Application Data

(63) Continuation-in-part of application No. 10/418,728, filed on Apr. 18, 2003, which is a continuation-in-part of application No. 10/268,195, filed on Oct. 10, 2002, now Pat. No. 6,797,340, which is a continuation-in-part of application No. 10/879,448, filed on Jun. 29, 2004, which is a continuation of application No. 10/268,195, filed on Oct. 10, 2002, now Pat. No. 6,797,340, which is a continuation-in-part of application No. 10/762,764, filed on Jan. 22, 2004, now abandoned, which is a continuation of application No. 09/678,266, filed on Oct. 3, 2000, now Pat. No. 7,101,795, which is a continuation-in-part of application No. 09/605,593, filed on Jun. 28, 2000, now Pat. No. 6,551,929, which is a continuation-in-part of application No. 10/196,514, filed on Jul. 15, 2002, now Pat. No. 6,936,538.

(60) Provisional application No. 11/038,592, filed on Jan. 19, 2005, provisional application No. 11/038,592, filed on Jan. 19, 2005, provisional application No. 60/305,765, filed on Jul. 16, 2001.

(51) Int. Cl.
H01L 21/44 (2006.01)

(52) U.S. Cl. ............... 438/680; 438/677; 257/E21.171; 257/E21.585

(58) Field of Classification Search ................ 438/677, 438/680; 257/E21.171, E21.585
See application file for complete search history.

(56) References Cited

U.S. PATENT DOCUMENTS

| | | | |
|---|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Nishizawa et al. |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |

| Patent No. | Date | Inventor | Patent No. | Date | Inventor |
|---|---|---|---|---|---|
| 4,960,720 A | 10/1990 | Shimbo | 5,749,974 A | 5/1998 | Habuka et al. |
| 4,975,252 A | 12/1990 | Nishizawa et al. | 5,788,447 A | 8/1998 | Yonemitsu et al. |
| 4,976,839 A * | 12/1990 | Inoue .................... 204/192.17 | 5,788,799 A | 8/1998 | Steger et al. |
| 4,993,357 A | 2/1991 | Scholz | 5,796,116 A | 8/1998 | Nakata et al. |
| 5,000,113 A | 3/1991 | Wang et al. | 5,801,634 A | 9/1998 | Young et al. |
| 5,013,683 A | 5/1991 | Petroff et al. | 5,804,488 A | 9/1998 | Shih et al. |
| 5,028,565 A | 7/1991 | Chang et al. | 5,807,792 A | 9/1998 | Ilg et al. |
| 5,082,798 A | 1/1992 | Arimoto | 5,830,270 A | 11/1998 | McKee et al. |
| 5,085,885 A | 2/1992 | Foley et al. | 5,835,677 A | 11/1998 | Li et al. |
| 5,091,320 A | 2/1992 | Aspnes et al. | 5,851,849 A | 12/1998 | Comizzoli et al. |
| 5,130,269 A | 7/1992 | Kitahara et al. | 5,855,675 A | 1/1999 | Doering et al. |
| 5,166,092 A | 11/1992 | Mochizuki et al. | 5,855,680 A | 1/1999 | Soininen et al. |
| 5,173,474 A | 12/1992 | Connell et al. | 5,856,219 A | 1/1999 | Naito et al. |
| 5,186,718 A | 2/1993 | Tepman et al. | 5,858,102 A | 1/1999 | Tsai |
| 5,205,077 A | 4/1993 | Wittstock | 5,866,213 A | 2/1999 | Foster et al. |
| 5,225,366 A | 7/1993 | Yoder | 5,866,795 A | 2/1999 | Wang et al. |
| 5,234,561 A | 8/1993 | Randhawa et al. | 5,879,459 A | 3/1999 | Gadgil et al. |
| 5,246,536 A | 9/1993 | Nishizawa et al. | 5,882,165 A | 3/1999 | Maydan et al. |
| 5,250,148 A | 10/1993 | Nishizawa et al. | 5,882,413 A | 3/1999 | Beaulieu et al. |
| 5,254,207 A | 10/1993 | Nishizawa et al. | 5,904,565 A | 5/1999 | Nguyen et al. |
| 5,256,244 A | 10/1993 | Ackerman | 5,916,365 A | 6/1999 | Sherman |
| 5,259,881 A | 11/1993 | Edwards et al. | 5,923,056 A | 7/1999 | Lee et al. |
| 5,270,247 A | 12/1993 | Sakuma et al. | 5,923,985 A | 7/1999 | Aoki et al. |
| 5,278,435 A | 1/1994 | Van Hove et al. | 5,925,574 A | 7/1999 | Aoki et al. |
| 5,281,274 A | 1/1994 | Yoder | 5,928,389 A | 7/1999 | Jevtic |
| 5,286,296 A | 2/1994 | Sato et al. | 5,942,040 A | 8/1999 | Kim et al. |
| 5,290,748 A | 3/1994 | Knuuttila et al. | 5,947,710 A | 9/1999 | Cooper et al. |
| 5,294,286 A | 3/1994 | Nishizawa et al. | 5,972,430 A | 10/1999 | DiMeo, Jr. et al. |
| 5,296,403 A | 3/1994 | Nishizawa et al. | 6,001,669 A | 12/1999 | Gaines et al. |
| 5,300,186 A | 4/1994 | Kitahara et al. | 6,015,590 A | 1/2000 | Suntola et al. |
| 5,306,666 A | 4/1994 | Izumi | 6,025,627 A | 2/2000 | Forbes et al. |
| 5,311,055 A | 5/1994 | Goodman et al. | 6,036,773 A | 3/2000 | Wang et al. |
| 5,316,615 A | 5/1994 | Copel et al. | 6,042,652 A | 3/2000 | Hyun et al. |
| 5,316,793 A | 5/1994 | Wallace et al. | 6,043,177 A | 3/2000 | Falconer et al. |
| 5,330,610 A | 7/1994 | Eres et al. | 6,051,286 A | 4/2000 | Zhao et al. |
| 5,336,324 A | 8/1994 | Stall et al. | 6,062,798 A | 5/2000 | Muka |
| 5,338,389 A | 8/1994 | Nishizawa et al. | 6,071,808 A | 6/2000 | Merchant et al. |
| 5,348,911 A | 9/1994 | Jurgensen et al. | 6,084,302 A | 7/2000 | Sandhu |
| 5,374,570 A | 12/1994 | Nasu et al. | 6,086,677 A | 7/2000 | Umotoy et al. |
| 5,395,791 A | 3/1995 | Cheng et al. | 6,110,556 A | 8/2000 | Bang et al. |
| 5,438,952 A | 8/1995 | Otsuka | 6,113,771 A | 9/2000 | Landau et al. |
| 5,439,876 A | 8/1995 | Graf et al. | 6,113,977 A | 9/2000 | Soininen et al. |
| 5,441,703 A | 8/1995 | Jurgensen | 6,117,244 A | 9/2000 | Bang et al. |
| 5,443,033 A | 8/1995 | Nishizawa et al. | 6,124,158 A | 9/2000 | Dautartas et al. |
| 5,443,647 A | 8/1995 | Aucoin et al. | 6,130,147 A | 10/2000 | Major et al. |
| 5,455,072 A | 10/1995 | Bension et al. | 6,139,700 A | 10/2000 | Kang et al. |
| 5,458,084 A | 10/1995 | Thorne et al. | 6,140,237 A | 10/2000 | Chan et al. |
| 5,469,806 A | 11/1995 | Mochizuki et al. | 6,140,238 A | 10/2000 | Kitch |
| 5,480,818 A | 1/1996 | Matsumoto et al. | 6,143,659 A | 11/2000 | Leem |
| 5,483,919 A | 1/1996 | Yokoyama et al. | 6,144,060 A | 11/2000 | Park et al. |
| 5,484,664 A | 1/1996 | Kitahara et al. | 6,156,382 A | 12/2000 | Rajagopalan et al. |
| 5,503,875 A | 4/1996 | Imai et al. | 6,158,446 A | 12/2000 | Mohindra et al. |
| 5,521,126 A | 5/1996 | Okamura et al. | 6,162,715 A * | 12/2000 | Mak et al. .................... 438/592 |
| 5,527,733 A | 6/1996 | Nishizawa et al. | 6,174,377 B1 | 1/2001 | Doering et al. |
| 5,532,511 A | 7/1996 | Nishizawa et al. | 6,174,809 B1 | 1/2001 | Kang et al. |
| 5,540,783 A | 7/1996 | Eres et al. | 6,174,812 B1 | 1/2001 | Hsiung et al. |
| 5,580,380 A | 12/1996 | Liu et al. | 6,194,310 B1 | 2/2001 | Hsu et al. |
| 5,601,651 A | 2/1997 | Watabe | 6,197,683 B1 | 3/2001 | Kang et al. |
| 5,609,689 A | 3/1997 | Kato et al. | 6,200,893 B1 | 3/2001 | Sneh |
| 5,616,181 A | 4/1997 | Yamamoto et al. | 6,203,613 B1 | 3/2001 | Gates et al. |
| 5,637,530 A | 6/1997 | Gaines et al. | 6,206,967 B1 | 3/2001 | Mak et al. |
| 5,641,984 A | 6/1997 | Aftergut et al. | 6,207,302 B1 | 3/2001 | Sugiura et al. |
| 5,644,128 A | 7/1997 | Wollnik et al. | 6,207,487 B1 | 3/2001 | Kim et al. |
| 5,667,592 A | 9/1997 | Boitnott et al. | 6,218,298 B1 | 4/2001 | Hoinkis |
| 5,674,786 A | 10/1997 | Turner et al. | 6,245,654 B1 * | 6/2001 | Shih et al. .................... 438/597 |
| 5,693,139 A | 12/1997 | Nishizawa et al. | 6,248,605 B1 | 6/2001 | Harkonen et al. |
| 5,695,564 A | 12/1997 | Imahashi | 6,258,713 B1 | 7/2001 | Yu et al. |
| 5,705,224 A | 1/1998 | Murota et al. | 6,270,572 B1 | 8/2001 | Kim et al. |
| 5,707,880 A | 1/1998 | Aftergut et al. | 6,271,148 B1 | 8/2001 | Kao et al. |
| 5,711,811 A | 1/1998 | Suntola et al. | 6,284,646 B1 * | 9/2001 | Leem .................... 438/629 |
| 5,730,801 A | 3/1998 | Tepman et al. | 6,287,965 B1 | 9/2001 | Kang et al. |
| 5,730,802 A | 3/1998 | Ishizumi et al. | 6,291,876 B1 | 9/2001 | Stumborg et al. |
| 5,747,113 A | 5/1998 | Tsai | 6,305,314 B1 | 10/2001 | Sneh et al. |

| | | | | | | |
|---|---|---|---|---|---|---|
| 6,306,216 | B1 | 10/2001 | Kim et al. | 2002/0076508 A1 | 6/2002 | Chiang et al. |
| 6,309,966 | B1 * | 10/2001 | Govindarajan et al. ...... 438/656 | 2002/0076837 A1 | 6/2002 | Hujanen et al. |
| 6,316,098 | B1 | 11/2001 | Yitzchaik et al. | 2002/0086111 A1 | 7/2002 | Byun et al. |
| 6,319,826 | B1 * | 11/2001 | Chen et al. ................. 438/653 | 2002/0086507 A1 | 7/2002 | Park et al. |
| 6,333,260 | B1 | 12/2001 | Kwon et al. | 2002/0090829 A1 | 7/2002 | Sandhu et al. |
| 6,335,280 | B1 | 1/2002 | Van der Jeugd | 2002/0094689 A1 | 7/2002 | Park |
| 6,342,277 | B1 | 1/2002 | Sherman | 2002/0104481 A1 | 8/2002 | Chiang et al. |
| 6,355,561 | B1 | 3/2002 | Sandhu et al. | 2002/0105055 A1 | 8/2002 | Buchanan et al. |
| 6,358,829 | B2 | 3/2002 | Yoon et al. | 2002/0105088 A1 | 8/2002 | Yang et al. |
| 6,368,954 | B1 | 4/2002 | Lopatin et al. | 2002/0106536 A1 | 8/2002 | Lee et al. |
| 6,369,430 | B1 | 4/2002 | Adetutu et al. | 2002/0106846 A1 | 8/2002 | Seutter et al. |
| 6,372,598 | B2 | 4/2002 | Kang et al. | 2002/0109168 A1 | 8/2002 | Kim et al. |
| 6,391,785 | B1 | 5/2002 | Satta et al. | 2002/0117399 A1 | 8/2002 | Chen et al. |
| 6,399,491 | B2 | 6/2002 | Jeon et al. | 2002/0121241 A1 | 9/2002 | Nguyen et al. |
| 6,416,822 | B1 | 7/2002 | Chiang et al. | 2002/0121342 A1 | 9/2002 | Nguyen et al. |
| 6,420,189 | B1 | 7/2002 | Lopatin | 2002/0121697 A1 | 9/2002 | Marsh |
| 6,423,619 | B1 | 7/2002 | Grant et al. | 2002/0144657 A1 | 10/2002 | Chiang et al. |
| 6,426,555 | B1 | 7/2002 | Hsia | 2002/0144855 A1 | 10/2002 | Chiang et al. |
| 6,428,859 | B1 | 8/2002 | Chiang et al. | 2002/0146511 A1 | 10/2002 | Chiang et al. |
| 6,447,933 | B1 | 9/2002 | Wang et al. | 2002/0155722 A1 | 10/2002 | Satta et al. |
| 6,451,119 | B2 | 9/2002 | Sneh et al. | 2002/0162506 A1 | 11/2002 | Sneh et al. |
| 6,451,695 | B2 | 9/2002 | Sneh | 2003/0013300 A1 | 1/2003 | Byun |
| 6,468,924 | B2 | 10/2002 | Lee et al. | 2003/0013320 A1 | 1/2003 | Kim et al. |
| 6,475,276 | B1 | 11/2002 | Elers et al. | 2003/0031807 A1 | 2/2003 | Elers et al. |
| 6,475,910 | B1 | 11/2002 | Sneh | 2003/0032281 A1 | 2/2003 | Werkhoven et al. |
| 6,482,262 | B1 | 11/2002 | Elers et al. | 2003/0049931 A1 | 3/2003 | Byun et al. |
| 6,482,733 | B2 | 11/2002 | Raaijmakers et al. | 2003/0049942 A1 | 3/2003 | Haukka et al. |
| 6,482,740 | B2 | 11/2002 | Soininen et al. | 2003/0053799 A1 | 3/2003 | Lei |
| 6,498,091 | B1 * | 12/2002 | Chen et al. .................. 438/627 | 2003/0054631 A1 | 3/2003 | Raaijmakers et al. |
| 6,534,395 | B2 | 3/2003 | Werkhoven et al. | 2003/0072975 A1 | 4/2003 | Shero et al. |
| 6,551,929 | B1 | 4/2003 | Kori et al. | 2003/0082296 A1 | 5/2003 | Elers et al. |
| 6,569,501 | B2 | 5/2003 | Chiang et al. | 2003/0082301 A1 | 5/2003 | Chen et al. |
| 6,599,572 | B2 | 7/2003 | Saanila et al. | 2003/0104126 A1 | 6/2003 | Fang et al. |
| 6,607,976 | B2 | 8/2003 | Chen et al. | 2003/0116087 A1 | 6/2003 | Nguyen et al. |
| 6,620,723 | B1 | 9/2003 | Byun et al. | 2003/0123216 A1 | 7/2003 | Yoon et al. |
| 6,630,201 | B2 | 10/2003 | Chiang et al. | 2003/0129826 A1 | 7/2003 | Werkhoven et al. |
| 6,635,965 | B1 * | 10/2003 | Lee et al. .................... 257/758 | 2003/0134508 A1 | 7/2003 | Raaijmakers et al. |
| 6,660,126 | B2 | 12/2003 | Nguyen et al. | 2003/0143328 A1 | 7/2003 | Chen et al. |
| 6,686,271 | B2 | 2/2004 | Raaijmakers et al. | 2003/0143839 A1 | 7/2003 | Raaijmakers et al. |
| 6,815,285 | B2 | 11/2004 | Choi et al. | 2003/0153181 A1 | 8/2003 | Yoon et al. |
| 6,838,376 | B2 * | 1/2005 | Matsuse et al. ............. 438/653 | 2003/0161952 A1 | 8/2003 | Wang et al. |
| 6,855,368 | B1 | 2/2005 | Kori et al. | 2003/0164421 A1 | 9/2003 | Collet et al. |
| 7,141,494 | B2 * | 11/2006 | Lee et al. .................... 438/627 | 2003/0164423 A1 | 9/2003 | Courtois et al. |
| 7,211,144 | B2 * | 5/2007 | Lu et al. ...................... 117/101 | 2003/0182320 A1 | 9/2003 | Lai et al. |
| 2001/0000866 | A1 | 5/2001 | Sneh et al. | 2003/0186495 A1 | 10/2003 | Saanila et al. |
| 2001/0002280 | A1 | 5/2001 | Sneh | 2003/0187256 A1 | 10/2003 | Berryman et al. |
| 2001/0009140 | A1 | 7/2001 | Bondestam et al. | 2003/0187631 A1 | 10/2003 | Masushige et al. |
| 2001/0009695 | A1 | 7/2001 | Saanila et al. | 2003/0190423 A1 | 10/2003 | Yang et al. |
| 2001/0011526 | A1 | 8/2001 | Doering et al. | 2003/0190804 A1 | 10/2003 | Glenn et al. |
| 2001/0024387 | A1 | 9/2001 | Raaijmakers et al. | 2003/0194493 A1 | 10/2003 | Chang et al. |
| 2001/0028924 | A1 | 10/2001 | Sherman | 2003/0194825 A1 | 10/2003 | Law et al. |
| 2001/0029094 | A1 | 10/2001 | Mee-Young et al. | 2003/0197402 A1 | 10/2003 | McCutcheon et al. |
| 2001/0031562 | A1 | 10/2001 | Raaijmakers et al. | 2003/0197863 A1 | 10/2003 | Snelling et al. |
| 2001/0034123 | A1 | 10/2001 | Jeon et al. | 2003/0203616 A1 | 10/2003 | Chung et al. |
| 2001/0041250 | A1 | 11/2001 | Werkhoven et al. | 2003/0224217 A1 | 12/2003 | Byun et al. |
| 2001/0042799 | A1 | 11/2001 | Kim et al. | 2004/0005749 A1 | 1/2004 | Choi et al. |
| 2001/0054730 | A1 | 12/2001 | Kim et al. | 2004/0009307 A1 | 1/2004 | Koh et al. |
| 2001/0054769 | A1 | 12/2001 | Raaijmakers et al. | 2004/0011504 A1 | 1/2004 | Ku et al. |
| 2002/0000598 | A1 | 1/2002 | Kang et al. | 2004/0013577 A1 | 1/2004 | Ganguli et al. |
| 2002/0004293 | A1 | 1/2002 | Soininen et al. | 2004/0014315 A1 | 1/2004 | Lai et al. |
| 2002/0007790 | A1 | 1/2002 | Park | 2004/0014320 A1 | 1/2004 | Chen et al. |
| 2002/0019121 | A1 | 2/2002 | Pyo | 2004/0015300 A1 | 1/2004 | Ganguli et al. |
| 2002/0031618 | A1 | 3/2002 | Sherman | 2004/0018304 A1 | 1/2004 | Chung et al. |
| 2002/0037630 | A1 | 3/2002 | Agarwal et al. | 2004/0018723 A1 | 1/2004 | Byun et al. |
| 2002/0048880 | A1 | 4/2002 | Lee | 2004/0041320 A1 | 3/2004 | Hodumi |
| 2002/0052097 | A1 | 5/2002 | Park | 2005/0006799 A1 | 1/2005 | Gregg et al. |
| 2002/0055235 | A1 | 5/2002 | Agarwal et al. | 2005/0031786 A1 * | 2/2005 | Lee et al. ............... 427/255.28 |
| 2002/0060363 | A1 | 5/2002 | Xi et al. | 2005/0191803 A1 * | 9/2005 | Matsuse et al. ............ 438/202 |
| 2002/0061612 | A1 | 5/2002 | Sandhu et al. | | | |
| 2002/0068458 | A1 | 6/2002 | Chiang et al. | | | |
| 2002/0073924 | A1 | 6/2002 | Chiang et al. | | | |
| 2002/0076481 | A1 | 6/2002 | Chiang et al. | DE | 196 27 017 A1 | 1/1997 |
| 2002/0076507 | A1 | 6/2002 | Chiang et al. | DE | 198 20 147 A1 | 7/1999 |

FOREIGN PATENT DOCUMENTS

| | | | | | | |
|---|---|---|---|---|---|---|
| EP | 0 344 352 A1 | 6/1988 | | JP | 03-022569 | 1/1991 |
| EP | 0 442 490 A1 | 2/1991 | | JP | 03-023294 | 1/1991 |
| EP | 0 429 270 A2 | 5/1991 | | JP | 03-023299 | 1/1991 |
| EP | 0 799 641 A2 | 10/1997 | | JP | 03-044967 | 2/1991 |
| EP | 1 167 567 A1 | 1/2002 | | JP | 03-048421 | 3/1991 |
| EP | 1 167 569 A | 1/2002 | | JP | 03-070124 | 3/1991 |
| FR | 2 626 110 A1 | 7/1989 | | JP | 03-185716 | 8/1991 |
| FR | 2 692 597 A1 | 12/1993 | | JP | 03-208885 | 9/1991 |
| GB | 2 355 727 A | 5/2001 | | JP | 03-234025 | 10/1991 |
| JP | 58-098917 | 6/1983 | | JP | 03-286522 | 12/1991 |
| JP | 58-100419 | 6/1983 | | JP | 03-286531 | 12/1991 |
| JP | 60-065712 | 4/1985 | | JP | 04-031391 | 2/1992 |
| JP | 61-035847 | 2/1986 | | JP | 04-031396 | 2/1992 |
| JP | 61-210623 | 9/1986 | | JP | 04-100292 | 4/1992 |
| JP | 62-069508 | 3/1987 | | JP | 04-111418 | 4/1992 |
| JP | 62-091495 | 4/1987 | | JP | 04-132214 | 5/1992 |
| JP | 62-141717 | 6/1987 | | JP | 04-132681 | 5/1992 |
| JP | 62-167297 | 7/1987 | | JP | 04-151822 | 5/1992 |
| JP | 62-171999 | 7/1987 | | JP | 04-162418 | 6/1992 |
| JP | 62-232919 | 10/1987 | | JP | 04-175299 | 6/1992 |
| JP | 63-062313 | 3/1988 | | JP | 04-186824 | 7/1992 |
| JP | 63-085098 | 4/1988 | | JP | 04-212411 | 8/1992 |
| JP | 63-090833 | 4/1988 | | JP | 04-260696 | 9/1992 |
| JP | 63-222420 | 9/1988 | | JP | 04-273120 | 9/1992 |
| JP | 63-222421 | 9/1988 | | JP | 04-285167 | 10/1992 |
| JP | 63-227007 | 9/1988 | | JP | 04-291916 | 10/1992 |
| JP | 63-252420 | 10/1988 | | JP | 04-325500 | 11/1992 |
| JP | 63-266814 | 11/1988 | | JP | 04-328874 | 11/1992 |
| JP | 64-009895 | 1/1989 | | JP | 05-029228 | 2/1993 |
| JP | 64-009896 | 1/1989 | | JP | 05-047665 | 2/1993 |
| JP | 64-009897 | 1/1989 | | JP | 05-047666 | 2/1993 |
| JP | 64-037832 | 2/1989 | | JP | 05-047668 | 2/1993 |
| JP | 64-082615 | 3/1989 | | JP | 05-074717 | 3/1993 |
| JP | 64-082617 | 3/1989 | | JP | 05-074724 | 3/1993 |
| JP | 64-082671 | 3/1989 | | JP | 05-102189 | 4/1993 |
| JP | 64-082676 | 3/1989 | | JP | 05-160152 | 6/1993 |
| JP | 01-103982 | 4/1989 | | JP | 05-175143 | 7/1993 |
| JP | 01-103996 | 4/1989 | | JP | 05-175145 | 7/1993 |
| JP | 64-090524 | 4/1989 | | JP | 05-182906 | 7/1993 |
| JP | 01-117017 | 5/1989 | | JP | 05-186295 | 7/1993 |
| JP | 01-143221 | 6/1989 | | JP | 05-206036 | 8/1993 |
| JP | 01-143233 | 6/1989 | | JP | 05-234899 | 9/1993 |
| JP | 01-154511 | 6/1989 | | JP | 05-235047 | 9/1993 |
| JP | 01-236657 | 9/1989 | | JP | 05-251339 | 9/1993 |
| JP | 01-245512 | 9/1989 | | JP | 05-270997 | 10/1993 |
| JP | 01-264218 | 10/1989 | | JP | 05-283336 | 10/1993 |
| JP | 01-270593 | 10/1989 | | JP | 05-291152 | 11/1993 |
| JP | 01-272108 | 10/1989 | | JP | 05-304334 | 11/1993 |
| JP | 01-290221 | 11/1989 | | JP | 05-343327 | 12/1993 |
| JP | 01-290222 | 11/1989 | | JP | 05-343685 | 12/1993 |
| JP | 01-296673 | 11/1989 | | JP | 06-045606 | 2/1994 |
| JP | 01-303770 | 12/1989 | | JP | 06-132236 | 5/1994 |
| JP | 01-305894 | 12/1989 | | JP | 06-177381 | 6/1994 |
| JP | 01-313927 | 12/1989 | | JP | 06-196809 | 7/1994 |
| JP | 02-012814 | 1/1990 | | JP | 06-222388 | 8/1994 |
| JP | 02-014513 | 1/1990 | | JP | 06-224138 | 8/1994 |
| JP | 02-017634 | 1/1990 | | JP | 06-230421 | 8/1994 |
| JP | 02-063115 | 3/1990 | | JP | 06-252057 | 9/1994 |
| JP | 02-074029 | 3/1990 | | JP | 06-291048 | 10/1994 |
| JP | 02-074587 | 3/1990 | | JP | 07-070752 | 3/1995 |
| JP | 02-106822 | 4/1990 | | JP | 07-086269 | 3/1995 |
| JP | 02-129913 | 5/1990 | | JP | 07-300649 | 11/1995 |
| JP | 02-162717 | 6/1990 | | JP | 08-181076 | 7/1996 |
| JP | 02-172895 | 7/1990 | | JP | 08-245291 | 9/1996 |
| JP | 02-196092 | 8/1990 | | JP | 08-264530 | 10/1996 |
| JP | 02-203517 | 8/1990 | | JP | 09-260786 | 10/1997 |
| JP | 02-230690 | 9/1990 | | JP | 09-293681 | 11/1997 |
| JP | 02-230722 | 9/1990 | | JP | 10-188840 | 7/1998 |
| JP | 02-246161 | 10/1990 | | JP | 10-190128 | 7/1998 |
| JP | 02-264491 | 10/1990 | | JP | 10-308283 | 11/1998 |
| JP | 02-283084 | 11/1990 | | JP | 11-269652 | 10/1999 |
| JP | 02-304916 | 12/1990 | | JP | 2000-031387 | 1/2000 |
| JP | 03-019211 | 1/1991 | | JP | 2000-058777 | 2/2000 |

| | | |
|---|---|---|
| JP | 2000-068072 | 3/2000 |
| JP | 2000-087029 | 3/2000 |
| JP | 2000-138094 | 5/2000 |
| JP | 2000-178735 | 6/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| JP | 2002-60944 | 2/2002 |
| JP | 2002-167672 | 6/2002 |
| JP | 2002-172767 | 6/2002 |
| JP | 2001-111000 | 12/2002 |
| WO | WO 90/02216 | 3/1990 |
| WO | WO 91/10510 | 7/1991 |
| WO | WO 93/02111 | 2/1993 |
| WO | WO 96/17107 | 6/1996 |
| WO | WO 96/18756 | 6/1996 |
| WO | WO 98/06889 | 2/1998 |
| WO | WO 98/51838 | 11/1998 |
| WO | WO 99/01595 A1 | 1/1999 |
| WO | WO 99/13504 | 3/1999 |
| WO | WO 99/29924 A1 | 6/1999 |
| WO | WO 99/41423 | 8/1999 |
| WO | WO 00/11721 | 3/2000 |
| WO | WO 00/15865 A1 | 3/2000 |
| WO | WO 00/15881 A2 | 3/2000 |
| WO | WO 00/16377 A2 | 3/2000 |
| WO | WO 00/54320 A1 | 9/2000 |
| WO | WO 00/63957 A1 | 10/2000 |
| WO | WO 00/79019 A1 | 12/2000 |
| WO | WO 00/79576 A1 | 12/2000 |
| WO | WO 01/15220 A1 | 3/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/36702 A1 | 5/2001 |
| WO | WO 01/40541 A1 | 6/2001 |
| WO | WO 01/66832 A2 | 9/2001 |
| WO | WO 02/01628 A2 | 1/2002 |
| WO | WO 02/45167 A2 | 6/2002 |
| WO | WO 02/45871 A1 | 6/2002 |
| WO | WO 02/46489 | 6/2002 |
| WO | WO 02/67319 A2 | 8/2002 |

OTHER PUBLICATIONS

Bader, et al. "Integrated Processing Equipment", Solid State Technology, Cowan Pub., vol. 33, No. 5 (May 1, 1990), pp. 149-154.
Bedair "Atomic Layer Epitaxy Deposition Processes", J. Vac. Sci. Techol. 12(1) (Jan./Feb. 1994).
Choi, et al. "Stability of $TiB_2$ as a Diffusion Barrier on Silicon", J. Electrochem. Soc. 138(10) (Oct. 1991), pp. 3063-3067.
Choi, et al. "The effect of annealing on resistivity of low pressure chemical vapor depositied titanium diboride", J. Appl. Phys. 69(11) (Jun. 1, 1991), pp. 7853-7861.
Derbyshire "Applications of Integrated Processing", Solid State Technology, US, Cowan Pub., vol. 37, No. 12 (Dec. 1, 1994), pp. 45-47.
Elam, et al. "Nucleation and Growth During Tungsten Atomic Layer Deposition on SiO2 Surfaces," Thin Solid Films 386 (2001) pp. 41-52, (Accepted Dec. 14, 2000).
Elers, et al. "$NbCl_5$ As A Precursor In Atomic Layer Epitaxy", Appl. Surf. Sci., vol. 82/83 (1994), pp. 468-474.
George, et al. "Atomic layer controlled deposition of $SiO_2$ and $Al_2O_3$ using ABAB . . . binary reaction sequence chemistry", Appl. Surf. Sci., vol. 82/83 (1994), pp. 460.
George, et al. "Surface Chemistry for Atomic Layer Growth", J. Phys. Chem., vol. 100 (1996), pp. 13121-13131.
Hultman, et al. "Review of the thermal and mechanical stability of TiN-based thin films", Zeitschrift Fur Metallkunde, 90(10) (Oct. 1999), pp. 803-813.
IBM Tech. Disc. Bull. Knowledge-Based Dynamic Scheduler in Distributed Computer Control, (Jun. 1990), pp. 80-84.
IBM Tech. Disc. Bull. "Multiprocessor and Multitasking Architecture for Tool Control of the Advanced via Inspection Tools" (May 1992), pp. 190-191.
Kitigawa, et al. "Hydrogen-mediated low temperature epitaxy of Si in plasma-enhanced chemical vapor deposition", Applied Surface Science (2000), pp. 30-34.
Klaus, et al. "Atomically Controlled Growth of Tungsten and Tungsten Nitride Using Sequential Surface Reactions", Applied Surface Science, pp. 479-491 (2000).
Klaus, et al. "Atomic Layer Deposition of $SiO_2$ Using Catalyzed and Uncatalyzed Self-Limiting Surface Reactions", Surface Review & Letters, 6(3&4) (1999), pp. 435-448.
Lee "The Preparation of Titanium-Based Thin Film by CVD Using Titanium Chlorides as precursors", Chemical Vapor Deposition, 5(2) (Mar. 1999), pp. 69-73.
Lee, et al. "Pulsed Nucleation for Ultra-High Aspect Ratio Tungsten Plugfill"; Materials Research Society, 2002, 649-653.
Martensson, et al. "Atomic Layer Eptiaxy of Copper and Tantalum," Chem. Vap. Deposition (1997) vol. 3, No. 1.
Martensson, et al. "Atomic Layer Epitaxy of Copper, Growth & Selectivity in the Cu (II)-2,2.6,6-Tetramethyl-3, 5-Heptanedion ATE-H2 Process", J. Electrochem. Soc., 145(8) (Aug. 1998), pp. 2926-2931.
Maydam, et al. "Cluster Tools for Fabrication of Advanced Devices" Jap. J. of Applied Physics, Extended Abstracts, 22nd Conference Solid State Devices and Materials (1990), pp, 849-852.
McGeachin "Synthesis and properties of some β-diketimines derived from acetylacetone, and their metal complexes", Canadian J. of Chemistry, vol. 46 (1968), p. 1903-1912.
Min, et al. "Chemical Vapor Deposition of Ti-Si-N Films with Alternating Source Supply", Mat., Res. Soc. Symp. Proc., vol. 564 (Apr. 5, 1999), pp. 207-210.
Min, et al. "Metal-Organic Atomic-Layer Deposition of Titanium-NitrideFilms", Applied Physics Letters, American Inst. Of Physics, vol. 75(11) (Sep. 13, 1999).
Min, et al. "Atomic layer deposition of TiN thin films by sequential introduction of Ti precursor and $NH_3$", Symp.: Advanced Interconnects and Contract Materials and Processes for Future Integrated Circuits (Apr. 13-16, 1998) pp. 337-342.
Niinisto, et al. "Synthesis of oxide thin films and overlayers by atomic layer epitaxy for advanced applications", Materials Science and Engineering B41, 1996, pp. 23-29.
Ohba, et al. "Thermal Decomposition of Methylhydrazine and Deposition Properties of CVD TiN Thin Films", Conference Proceedings, Advanced Metallization for ULSI Applications in 1993 (1994), pp. 143-149.
Ritala, et al. "Atomic Layer Epitaxy Growth of TiN Thin Films", J. Electrochem. Soc., 142(8) (Aug. 1995), pp. 2731-2737.
Ritala, et al. "Perfectly Conformal TiN and $Al_2O_3$ Films Deposited by Atomic Layer Deposition", Chemical Vapor Deposition, ISSN 0948-1907, CVDEFX, vol. 5, Jan. 1999, No. 1, pp. 7-9.
Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.
Scheper, et al. "Low-temperature deposition of titanium nitride films from dialkylhydrazine-based precursors", Materials Science in Semiconductor Processing 2 (1999), pp. 149-157.

Solanki, et al. "Atomic Layer deposition of Copper Seed Layers", Electrochemical and Solid State Letters, 3(10) (2000), pp. 479-480.

Suzuki, et al. "A 0.2- μm contact filing by 450° C-hydrazine-reduced TiN film with low resistivity", IEDM 92-979, pp. 11.8.1-11.8.3.

Suzuki, et al. "LPCVD-TiN Using Hydrazine and TiCl$_4$", VMIC Conference (Jun. 8-9, 1993), pp. 418-423.

Wise, et al. "Diethyldiethoxysilane as a new precursor for SiO$_2$ growth on silicon", Mat. Res. Soc. Symp. Proc., vol. 334 (1994), pp. 37.

Yamaga, et al. "Atomic Layer Epitaxy Of ZnS By A New Gas Supplying System In A Low-Pressure Metalorganic Vapor Phase Epitaxy", J. of Crystal Growth 117 (1992), pp. 152-155.

Yamaguchi, et al. "Atomic-layer chemical-vapor-deposition of silicon dioxide films with extremely low hydrogen content", Appl. Surf. Sci., vol. 130-132 (1998), pp. 202-207.

Yang, et al. "Atomic Layer Deposition of Tungsten Film from WF$_6$/B$_2$H$_6$: Nucleation Layer for Advanced Semiconductor Device," Conference Proceedings ULSI XVII (2002) Materials Research Society.

\* cited by examiner

*Primary Examiner*—Michael S. Lebentritt
*Assistant Examiner*—Stanetta D Isaac
(74) *Attorney, Agent, or Firm*—Patterson & Sheridan, LLP

(57) ABSTRACT

In one embodiment of the invention, a method for forming a tungsten-containing layer on a substrate is provided which includes positioning a substrate containing a barrier layer disposed thereon in a process chamber, exposing the substrate to a first soak process for a first time period and depositing a nucleation layer on the barrier layer by flowing a tungsten-containing precursor and a reductant into the process chamber. The method further includes exposing the nucleation layer to a second soak process for a second time period and depositing a bulk layer on the nucleation layer. In one example, the barrier layer contains titanium nitride, the first and second soak processes independently comprise at least one reducing gas selected from the group consisting of hydrogen, silane, disilane, dichlorosilane, borane, diborane, derivatives thereof and combinations thereof and the nucleation layer may be deposited by an atomic layer deposition process or a pulsed chemical vapor deposition process while the bulk layer may be deposited by a chemical vapor deposition process or a physical vapor deposition process.

29 Claims, 7 Drawing Sheets

METHODS FOR DEPOSITING TUNGSTEN LAYERS EMPLOYING ATOMIC LAYER DEPOSITION TECHNIQUES

CROSS-REFERENCE TJO RELATED APPLICATIONS

This application is a continuation-in-part of U.S. patent application Ser. No. 10/418,728, entitled "Method for Depositing Refractory Metal Layers Employing Sequential Deposition Techniques," filed on Apr. 18, 2003, which is a continuation-in-part of U.S. patent Ser. No. 10/268,195 filed Oct. 10, 2002 now U.S. Pat. No. 6,797,340, filed Oct. 10, 2002, which claims priority to U.S. Provisional Patent Application Ser. No. 60/328,451, entitled "Method and Apparatus for Depositing Refractory Metal Layers Employing Sequential Deposition Techniques," filed on Oct. 10, 2001, which are all hereby incorporated by reference in their entirety. This application is also a continuation-in-part of U.S. patent No. application Ser. No. 10/879,448, entitled, "Method for Depositing Refractory Metal Layers Employing Sequential Deposition Techniques," filed Jun. 29, 2004, which is a continuation of U.S. patent Ser. No. 10/268,195 filed Oct. 10, 2002 now U.S. Pat. No. 6,797,340, filed Oct. 10, 2002, which claims priority to U.S. Provisional Patent Application Ser. No. 60/328,451, entitled "Method and Apparatus for Depositing Refractory Metal Layers Employing Sequential Deposition Techniques," filed on Oct. 10, 2001, which are all hereby incorporated by reference in their entirety. This application is also a continuation-in-part of U.S. patent application Ser. No. 10/762,764, entitled "Method and Apparatus for Depositing Refractory Metal Layers Employing Sequential Deposition Techniques to form Nucleation Layer," filed on Jan. 22, 2004 now abandoned, which is a continuation of U.S. patent application Ser. No. 09/678,266, entitled "Method and Apparatus for Depositing Refractory Metal Layers Employing Sequential Deposition Techniques to Form Nucleation Layer," filed on Oct. 3, 2000, and issued as U.S. Pat. No. 7,101,795, which is a continuation-in-part of U.S. patent Ser. No. 09/605,593 filed Jun. 28, 2000 now U.S. Pat. No. 6,551,929, filed on Jun. 28, 2000, which are all hereby incorporated by reference in their entirety. This application is also a continuation-in-part of U.S. patent application Ser. No. 10/196,514, entitled "Method and Apparatus for Depositing Tungsten After Surface Treatment to Improve Film Characteristics," filed on Jul. 15, 2002, and issued as U.S. Pat. No. 6,936,538, which claims priority to U.S. Provisional Patent Application Ser. No. 60/305,765, entitled "Method and Apparatus for Depositing Tungsten After Surface Treatment to Improve Film Characteristics," filed on Jul. 16, 2001, which are both hereby incorporated by reference in their entirety.

BACKGROUND OF THE INVENTION

1. Field of the Invention

Embodiments of the invention relate to the processing of semiconductor substrates. More particularly, embodiments of the invention relate to deposition of tungsten layers on semiconductor substrates using vapor deposition techniques.

2. Description of the Related Art

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Formation of film layers at a high deposition rate while providing adequate step coverage are conflicting characteristics often necessitating the sacrifice of one to obtain the other. This conflict is true particularly when refractory metal layers are deposited over gaps or vias during the formation of contacts interconnecting adjacent metallic layers separated by dielectric layers. Historically, CVD techniques have been employed to deposit conductive material such as refractory metals in order to inexpensively and quickly form contacts. Due to the increasing integration of semiconductor circuitry, tungsten has been used based upon superior step coverage. As a result, deposition of tungsten employing CVD techniques enjoys wide application in semiconductor processing due to the high throughput of the process.

Depositing tungsten by conventional CVD methods, however, is attendant with several disadvantages. For example, ALD processes deposit tungsten films into vias containing high aspect ratios (e.g., 20), whereas conventional CVD processes will usually cause similar vias to "pinch-off" and not completely fill. Also, blanket deposition of a tungsten layer on a semiconductor wafer is time-consuming at temperatures below 400° C. The deposition rate of tungsten may be improved by increasing the deposition temperature to, for example, about 500° C. to about 550° C. However, temperatures in this higher range may compromise the structural and operational integrity of the underlying portions of the integrated circuit being formed. Use of tungsten has also frustrated photolithography steps during the manufacturing process as it results in a relatively rough surface having a reflectivity of 70% or less than that of silicon (thickness and wavelength dependent). Further, tungsten has proven difficult to deposit uniformly. Poor surface uniformity typically increases film resistivity.

Therefore, there is a need for an improved technique to deposit conductive layers with good uniformity using cyclical deposition techniques.

SUMMARY OF THE INVENTION

In one embodiment of the invention, a method for forming a tungsten-containing layer on a substrate is provided which includes positioning a substrate containing a barrier layer disposed thereon in a process chamber, exposing the substrate to a first soak process for a first time period and depositing a nucleation layer on the barrier layer by flowing a tungsten-containing precursor and a reductant into the process chamber. The method further includes exposing the nucleation layer to a second soak process for a second time period and depositing a bulk layer on the nucleation layer. In one example, the barrier layer contains titanium nitride, the first and second soak processes independently comprise at least one reducing gas selected from the group consisting of hydrogen, silane, disilane, dichlorosilane, borane, diborane, derivatives thereof and combinations thereof and the nucleation layer may be deposited by an atomic layer deposition process or a pulsed chemical vapor deposition process while the bulk layer may be deposited by a chemical vapor deposition process or a physical vapor deposition process.

In another example of the invention, a method for forming a tungsten-containing layer on a substrate is provided which includes positioning a substrate containing a barrier layer disposed thereon in a process chamber and exposing the substrate to a first reductant to form a first treated surface on the barrier layer. The method further includes depositing a nucleation layer on the treated surface by a vapor deposition process, exposing the substrate to a second reductant to form a second treated surface, and depositing a bulk layer on the second treated surface.

In another example of the invention, a method for forming a tungsten-containing layer on a substrate is provided which includes positioning a substrate in a process chamber, depositing a nucleation layer on the substrate by a vapor deposition process, exposing the nucleation layer to a second soak process to form a treated surface, and depositing a bulk layer on the second treated surface.

In another example of the invention, a method for forming a tungsten-containing layer on a substrate is provided which includes positioning a substrate containing a barrier layer disposed thereon in a process chamber, exposing the substrate to a first soak process and depositing a nucleation layer on the barrier layer by a pulsed chemical vapor deposition process or an atomic layer deposition process. The method further includes exposing the nucleation layer to a second soak process and depositing a bulk layer on the nucleation layer by a chemical vapor deposition process or a physical vapor deposition process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION OF THE INVENTION

Figure 1:
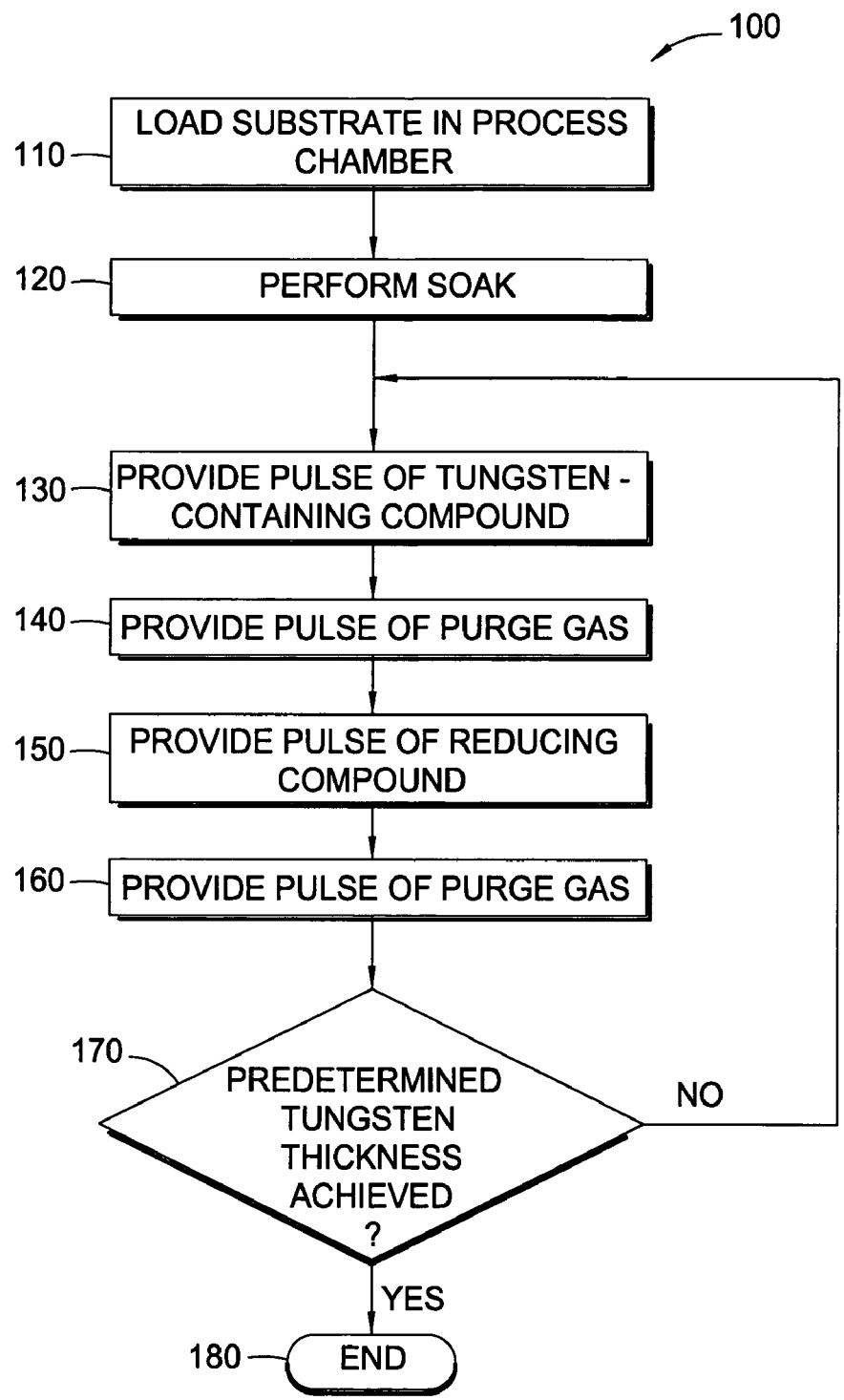
FIG. 1 illustrates a process sequence for the formation of a tungsten layer using a cyclical deposition technique according to one embodiment described herein.

Embodiments of the invention provide an improved process for depositing tungsten-containing films. The process utilizes soak processes and vapor deposition processes, such as an atomic layer deposition (ALD) or pulsed-CVD to provide tungsten films having significantly improved surface uniformity and production level throughput. In one aspect, the process includes at least one soak process prior to tungsten deposition to activate the underlying surface on the substrate. Preferably, the underlying surface is exposed to a reductant, such as diborane ($B_2H_6$) or silane ($SiH_4$), although it is believed that other reductant will achieve similar results. In general, the soak process may occur in-situ for a period of time in a range from about 1 second to about 90 seconds at similar processing conditions as a subsequent tungsten deposition process, thereby significantly increasing production throughput. For example, a soak process may be conducted to the barrier layer prior to depositing a nucleation layer thereon and/or a soak process may be conducted to the nucleation layer prior to depositing a bulk layer thereon.

A "substrate surface", as used herein, refers to any substrate or material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes.

"Atomic layer deposition" or "cyclical deposition" as used herein refers to the sequential introduction of two or more reactive compounds to deposit a layer of material on a substrate surface. The two or more reactive compounds are alternatively introduced into a reaction zone of a processing chamber. Each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

FIG. 1 illustrates an exemplary process sequence 100 for forming an improved tungsten-containing film according to one embodiment of the invention. A substrate to be processed is first loaded into a process chamber capable of performing cyclical deposition and the process conditions are adjusted (step 110). The substrate is then exposed to a soak process lasting in a range from about 1 second to about 90 seconds (step 120). A pulse of a tungsten-containing precursor accompanied with a suitable carrier gas is introduced into the processing chamber (step 130). A pulse of gas is then pulsed into the process chamber (step 140) to purge or otherwise remove any residual tungsten-containing precursor or by-products. Next, a pulse of a reductant or reducing compound accompanied with a suitable carrier gas is introduced into the process chamber (step 150). The reducing gas may be the same compound as the gas used for the soak process (step 120) or alternatively, the reducing gas may be a different compound, depending on the product throughput requirements and the device applications. A pulse of purge gas is then introduced into the processing chamber (step 160) to purge or otherwise remove any residual reducing compound.

Suitable carrier gases or purge gases include helium, argon, nitrogen, hydrogen, forming gas and combinations thereof. Typically, the borane compounds utilize argon or nitrogen as a carrier gas and the silane compounds use hydrogen, argon or nitrogen as the carrier gas.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself.

Referring to step 170, after each deposition cycle (steps 130 through 160), a tungsten nucleation layer having a particular thickness will be deposited on the substrate surface. Usually, each deposition cycle forms a layer with a thickness in the range from about 1 Å to about 10 Å. Depending on specific device requirements, subsequent deposition cycles may be needed to deposit tungsten nucleation layer having a desired thickness. As such, a deposition cycle (steps 130 through 160) can be repeated until the desired thickness for the tungsten film is achieved. The nucleation layer is typically deposited to a thickness in a range from about 10 Å to about 200 Å. Thereafter, the process is stopped as indicated by step 180 when the desired thickness is achieved.

Suitable tungsten-containing precursors or compounds include tungsten hexafluoride ($WF_6$), tungsten hexachloride ($WCl_6$), tungsten carbonyl ($W(CO)_6$), bis(cyclopentadienyl) tungsten dichloride ($Cp_2WCl_2$) and mesitylene tungsten tricarbonyl ($C_9H_{12}W(CO)_3$), as well as derivatives thereof. Suitable reducing compounds and soak compounds include silane compounds, borane compounds, phosphine compounds, ammonia and ammine compounds and hydrogen. Silane compounds include silane, disilane, trisilane, tetrasilane, chlorosilane, dichlorosilane, tetrachlorosilane, hexachlorodisilane and derivatives thereof, while borane compounds include borane, diborane, triborane, tetraborane, pentaborane, alkylboranes, such as triethylborane and derivatives thereof. The preferred reducing compounds and reductant for the soak process include silane, disilane, diborane, hydrogen and combinations thereof.

The substrate surface generally contains a barrier layer disposed thereon. The tungsten nucleation layer is deposited on the barrier layers. The substrate surface is exposed to a soak process at a temperature in the range from about 100° C. to about 600° C., preferably in the range from about 100° C. to about 500° C., more preferably in the range from about 300° C. to about 450° C. In one example, the temperature of the soak process is maintained for the subsequent vapor deposition process. The soak process (step 120) is typically performed with the process chamber at a pressure in the range from about 1 Torr to about 150 Torr, preferably in the range from about 5 Torr to about 90 Torr. In some examples, a pressure is in a range from about 5 Torr to about 20 Torr. In another example, the pressure is about 40 Torr. The soak process is usually conducted to the substrate surface for a time period in the range from about 1 second to about 90 seconds. In one example, the soak process will last for about 60 seconds or less. In another example, the soak process will last for about 30 seconds or less. In another aspect, the soak process will last for about 10 seconds. The soak process includes a soak compound, such as a reductant and usually has a carrier gas. The flow rate of the reductant is generally in the range from about 10 sccm to about 2,000 sccm, preferably in the range from about 50 sccm to about 500 sccm. The flow rate of the carrier gas is generally in the range from about 10 sccm to about 2,000 sccm, preferably in the range from about 50 sccm to about 500 sccm.

The barrier layer disposed on the substrate is reduced and/or adsorbs the reductant to form a conditioned layer for the subsequent nucleation layer. The conditioned barrier layer provides for a quicker and smoother deposition of the nucleation layer. In one example, diborane is introduced with hydrogen, each having a flow rate in a range from about 50 sccm to about 500 sccm. Preferably, the diborane and hydrogen gases are introduced in a 1:1 volumetric ratio. In another example, silane is introduced with hydrogen, each having a flow rate in a range from about 50 sccm to about 500 sccm. Preferably in step 120, the reductant or soak compound utilized in the soak process is diborane or silane.

In step 130, the tungsten-containing precursor is preferably tungsten hexafluoride and introduced at a rate in the range from about 5 sccm to about 200 sccm. The tungsten-containing precursor can be introduced with a carrier gas, such as argon with a flow rate in the range from about 50 sccm to about 1,000 sccm. In step 150, the reductant is preferably diborane or silane and introduced at a rate in the range from about 5 scorn to about 2,000 sccm, preferably in the range from about 50 scorn to about 500 sccm. The reductant can be introduced with a carrier gas, such as hydrogen, with a flow rate in the range from about 50 sccm to about 2,000 sccm. The pulses of a purge gas, preferably argon or nitrogen, at steps 140 and 160, are typically introduced at a rate from about 50 sccm to about 2,000 sccm, preferably at about 500 sccm. Steps 140 and 160 may include a continuous flow of purge gas whereas the tungsten-containing compound and the reducing gas are pulsed into a steady stream of carrier gas. Each processing step (steps 130 through 160) lasts from about 0.01 seconds to about 10 seconds, preferably in the range from about 0.1 seconds to about 1 second. Longer processing steps, such as about 30 seconds or about 60 seconds, achieve tungsten deposition. However, the throughput is reduced. The specific pressures and times are obtained through experimentation. In one example, a 300 mm diameter wafer needs about twice the flow rate as a 200 mm diameter wafer in order to maintain similar throughput.

An ALD process chamber used during embodiments described herein is available from Applied Materials, Inc. located in Santa Clara, Cali. A more detailed description of an ALD process chamber may be found in commonly assigned U.S. Ser. No. 10/032,284, filed on Dec. 21, 2001, and issued as U.S. Pat. No. 6,916,398, U.S. Ser. No. 10/281,079, filed on Oct. 25, 2002, and published as US 2003-0121608, and U.S. Ser. No. 10/016,300, filed on Dec. 12, 2001, and issued as U.S. Pat. No. 6,878,206, which are hereby incorporated by reference in their entirety. Software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to aspects of the invention. Alternatively, the software routines may be performed in hardware, as an application specific integrated circuit or other type of hardware implementation, or a combination of software or hardware.

Figure 2:
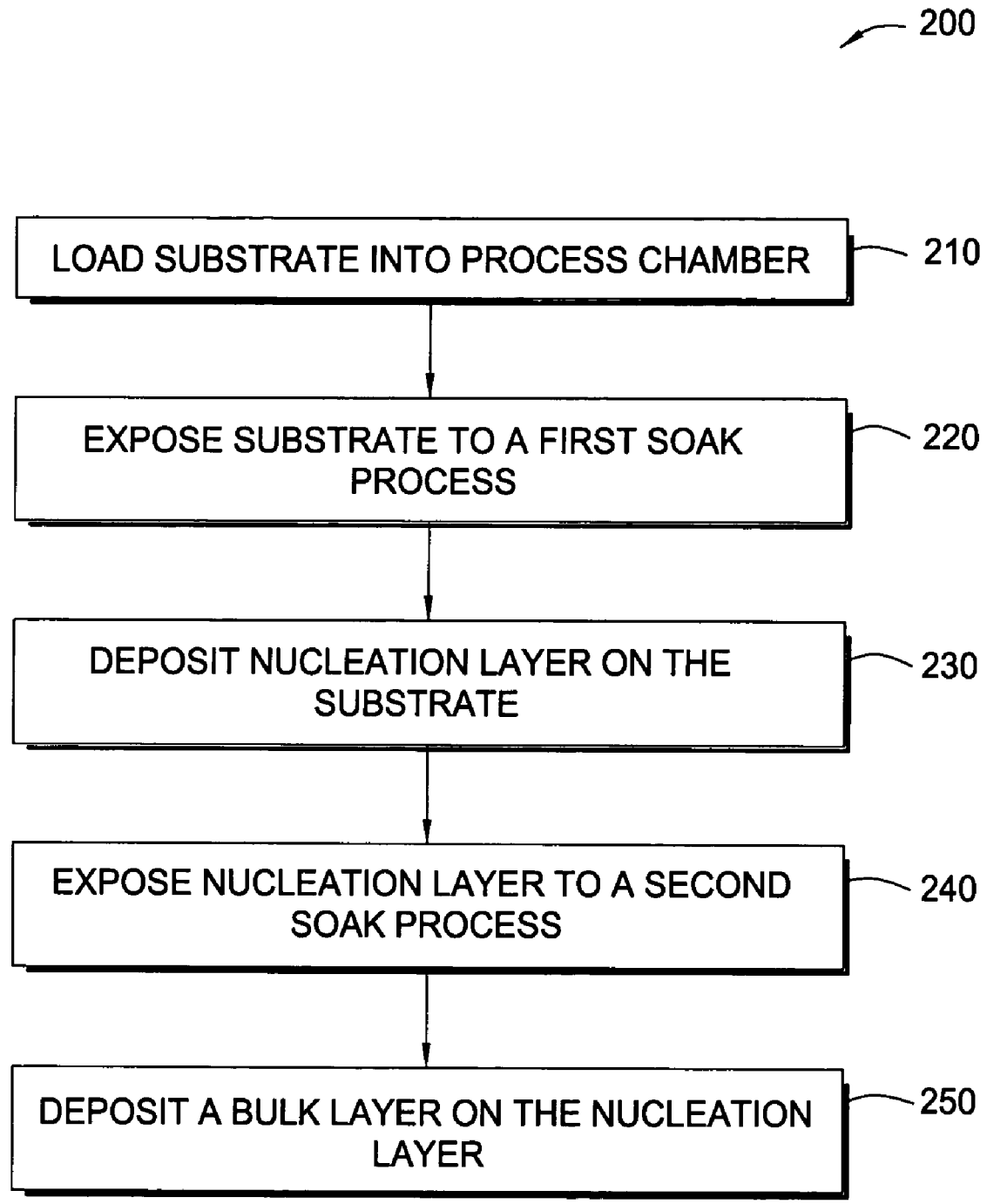
FIG. 2 illustrates a process sequence for the forming of a tungsten-containing material according to one embodiment described herein.

FIG. 2 illustrates process 200 for the forming of a tungsten-containing material according to one embodiment described herein. During step 210, the substrate is loaded into a process chamber. The substrate usually contains a barrier layer disposed thereon and is exposed to a first soak process during step 220. The soak process includes delivering a reducing gas containing a reductant into the process chamber. The substrate surface forms a treated layer, such as a reduced barrier layer. During step 230, a nucleation layer (e.g., tungsten) is deposited on the substrate. Generally, the nucleation layer is deposited by a vapor deposition process that includes ALD, CVD or pulsed-CVD. In step 240, the nucleation layer is exposed to a second soak process with the same or a different reductant as used in step 220. Thereafter, a bulk layer (e.g., tungsten) is deposited on the nucleation layer during step 250. The bulk layer may be deposited by a CVD process or a PVD process.

During step 210, the substrate is positioned into the process chamber. The substrate surface may contain a barrier layer disposed thereon. Barrier layers usually contain a metal or metal nitride material that includes titanium, titanium nitride, titanium silicon nitride, tantalum, tantalum nitride, tantalum silicon nitride, and combinations thereof. A barrier layer may be formed by process techniques such as chemical vapor deposition (CVD), atomic layer deposition (ALD), physical vapor deposition (PVD), derivatives thereof and combinations thereof. The barrier layer is usually deposited to a thickness of at least about 30 Å, such as in a range from about 30 Å to about 100 Å. In one example, a barrier layer is deposited on the substrate surface by a CVD process by using tetrakis (dimethylamino)titanium (TDMAT) and ammonia. In another example, a barrier layer is deposited on the substrate surface by an ALD process by sequentially pulsing titanium tetrachloride ($TiCl_4$) and ammonia. In another example, a barrier layer is deposited on the substrate surface by a PVD process by sputtering from a titanium source in a nitrogen environment. The barrier layer may be plasma densified prior to performing a subsequent fabrication process.

The process conditions, such as temperature and pressure, set during step 210 may be used during step 220. The process chamber is adjusted to heat the substrate at a temperature in the range from about 100° C. to about 600° C., preferably in the range from about 200° C. to about 500° C., and more preferably in the range from about 300° C. to about 450° C. The process chamber is maintained at a pressure in the range from about 1 Torr to about 150 Torr, preferably in the range from about 5 Torr to about 90 Torr. In one example, the process chamber used during the soak process may be the same process chamber as used to deposit the barrier layer. In another example, the process chamber used during the soak process is used to deposit the subsequent nucleation layer during step 230.

During step 220, the substrate surface is exposed to a soak process containing a reductant and an optional carrier gas. The reductant adsorbs and/or reacts to the substrate surface, namely the barrier layer, to form a treated surface. The treated surface provides a quicker deposition process for an overall smooth and more uniform tungsten layer. The reductants may include silane compounds, borane compounds, phosphine compounds, ammonia and ammine compounds and hydrogen. Silane compounds include silane, disilane, trisilane, tetrasilane, chlorosilane, dichlorosilane, tetrachlorosilane, hexachlorodisilane and derivatives thereof, while borane compounds include borane, diborane, triborane, tetraborane, pentaborane, alkylboranes, such as triethylborane and derivatives thereof. The preferred reductants include silane, disilane, diborane and hydrogen. A carrier gas may be co-flowed with the reductant. Carrier gases include hydrogen, nitrogen, argon, helium and combinations thereof. For example, diborane is often used with a concentration of 5 vol % in argon or nitrogen.

The soak process in step 220 usually last for a period of time in the range from about 1 second to about 90 seconds. The barrier layer disposed on the substrate is reduced and/or adsorbs the reductant to form a conditioned layer for the subsequent nucleation layer. In one example performed prior to an ALD nucleation process, about 300 sccm of a 5 vol % diborane in argon is exposed to the substrate for about 30 seconds at about 15 Torr and about 350° C. In one example performed prior to a pulsed-CVD nucleation process, about 200 sccm of a 5 vol % diborane in nitrogen is exposed to the substrate for about 24 seconds at about 90 Torr and about 400° C.

During step 230, a nucleation layer is deposited on the substrate surface, namely on the treated barrier layer. The nucleation layer may be deposited by a vapor deposition process that includes ALD, CVD and/or pulsed-CVD. The process chamber used to deposit the nucleation layer may be the same process chamber used in the soak processes as described in steps 220 and 240. The nucleation layer may comprise tungsten, tungsten alloys, tungsten-containing materials (e.g., tungsten boride or tungsten silicide) and combinations thereof. The nucleation layer is typically deposited to a thickness in a range from about 10 Å to about 200 Å. In one example, an ALD process utilizing $WF_6$ and $B_2H_6$ deposits a nucleation layer with a thickness in a range from about 10 Å to about 20 Å, such as about 12 Å. In another example, an ALD process utilizing $WF_6$ and $SiH_4$ deposits a nucleation layer with a thickness in a range from about 10 Å to about 50 Å, such as about 30 Å. In another example, a pulsed-CVD (e.g., co-flowed) process utilizing $WF_6$ and $SiH_4$ or $WF_6$ and $B_2H_6$ deposits a nucleation layer with a thickness in a range from about 30 Å to about 200 Å, such as about 50 Å. Preferably, the ALD process as described herein during process 100 may be used to deposit the nucleation layer.

During step 240, the substrate surface is exposed to a post soak process or a second soak process containing a reductant and an optional carrier gas. The reductant adsorbs and/or reacts to the substrate surface, namely the nucleation layer, to form a treated surface. The reductants, as described above, may also include silane compounds, borane compounds, phosphine compounds, ammonia and ammine compounds and hydrogen. The preferred reductants include silane, disilane, diborane and hydrogen. A carrier gas may be co-flowed with the reductant and include hydrogen, nitrogen, argon, helium and combinations thereof. For example, diborane is often used with a concentration of 5 vol % in argon or nitrogen.

The soak process in step 240 usually last for a period of time in the range from about 1 second to about 90 seconds. The process chamber is adjusted to heat the substrate at a temperature in the range from about 100° C. to about 600° C., preferably in the range from about 200° C. to about 500° C., more preferably in the range from about 300° C. to about 450° C. The process chamber is maintained at a pressure in the range from about 1 Torr to about 150 Torr, preferably in the range from about 5 Torr to about 90 Torr. The barrier layer disposed on the substrate is reduced and/or adsorbs the reductant to form a conditioned layer for the subsequent bulk layer. In one example performed after an ALD nucleation process, about 300 sccm of a 5 vol % diborane in nitrogen is exposed to the substrate for about 30 seconds at about 30 Torr and about 300° C. In one example performed after a pulsed-CVD nucleation process, about 200 sccm of a 5 vol % diborane in argon is exposed to the substrate for about 30 seconds at about 15 Torr and about 400° C. In another example performed after a pulsed-CVD nucleation process, about 300 sccm of a 5 vol % diborane in argon is exposed to the substrate for about 10 seconds at about 90 Torr and about 400° C.

During step 250, a bulk layer is deposited on the substrate surface, namely on the treated nucleation layer. The bulk layer may be deposited by a vapor deposition process that includes CVD, pulsed-CVD and/or PVD. The process chamber used to deposit the bulk layer may be the same process chamber used in the post soak process as described in step 240. The bulk layer comprises tungsten, tungsten alloys, tungsten-containing materials (e.g., tungsten boride, tungsten silicide or tungsten phosphide) and combinations thereof. The bulk layer is typically deposited to a thickness in the range from about 100 Å to about 10,000 Å, preferably from about 1,000 Å to about 5,000 Å. In one example, a CVD process utilizing $WF_6$ and $B_2H_6$ is used to deposit a bulk layer on the treated nucleation layer. In another example, a CVD process utilizing $WF_6$ and $SiH_4$ is used to deposit a bulk layer on the treated nucleation layer. In another example, a PVD process utilizing a tungsten source is used to deposit a bulk layer on the treated nucleation layer. Processes for soaking a tungsten nucleation layer and depositing a tungsten bulk layer thereon is further described in the commonly assigned U.S. Pat. No. 6,156,382, which is incorporated by reference herein.

In an alternative embodiment, a tungsten-containing film is deposited by depositing more than one nucleation layer and may include multiple cycles of a vapor deposition process. In one example, the barrier layer may be exposed to a soak process prior to forming a first nucleation layer by a pulsed-CVD process. The process chamber is heated to a temperature in a range from about 400° C. to about 450° C., for example, about 425° C. and maintained at a pressure in a range from about 10 Torr to about 20 Torr, such as about 15 Torr. The pulsed-CVD process may include exposing the substrate to a co-flow of a tungsten-containing compound and a reductant for a period of time from about 1 second to about 3 seconds, for example about 1.5 seconds. The flow of the reagents include the tungsten-containing compound with a flow rate from about 30 sccm to about 90 sccm, such as about 60 sccm, while the reductant is at a flow rate from about 10 sccm to about 50 sccm, such as about 30 sccm. The co-flow is stopped and the process chamber purged. Then the reductant is pulsed into the chamber for a period of time from about 1 second to about 3 seconds, for example about 1 second. The reductant may have a flow rate from about 10 sccm to about 50 sccm, such as about 30 sccm. The flow of the reductant is stopped and the chamber purged for about 0.5 seconds. The cycle is repeated until a predetermined thickness of the first nucleation layer is formed. For example, the process is repeated 3 times to form a layer with a thickness about 30 Å. The preferred tungsten-containing compound is tungsten hexafluoride and the preferred reductant is silane and/or diborane. The reductant is optionally used during a soak process prior or subsequent the deposition of the first nucleation layer.

A second nucleation layer may be formed on the first nucleation layer. The process chamber may be kept at the same temperature, but the pressure of the process chamber is usually increased. The process chamber is maintained at a temperature in a range from about 400° C. to about 450° C., for example, about 425° C. and the a pressure is in a range from about 20 Torr to about 50 Torr, such as about 30 Torr. The CVD process may include exposing the substrate to a co-flow of a tungsten-containing compound and a reductant for a period of time from about 4 seconds to about 8 seconds, for example about 6 seconds. The flow of the reagents include the tungsten-containing compound with a flow rate from about 30 sccm to about 70 sccm, such as about 50 sccm, while the reductant has a flow rate from about 10 sccm to about 50 sccm, such as about 25 sccm. A second nucleation layer is deposited on the first nucleation layer and has a thickness in a range from about 50 Å to about 1,000 Å, preferably from about 150 Å to about 300 Å. The preferred tungsten-containing compound is tungsten hexafluoride and the preferred reductant is silane and/or diborane. The reductant is optionally used during a soak process prior or subsequent the deposition of the second nucleation layer.

Finally, a bulk layer may be deposited on the second nucleation layer. The bulk layer may be deposited by a tradition CVD process. In one example, the process chamber is maintained at a temperature in a range from about 400° C. to about 450° C., for example, about 425° C. and the pressure is maintained in a range from about 100 Torr to about 350 Torr, such as about 200 Torr. The flow of the reagents include the tungsten-containing compound with a flow rate from about 200 sccm to about 800 sccm, such as about 400 sccm, while the reductant has a flow rate from about 2,000 sccm to about 8,000 sccm, such as about 4,000 sccm. The preferred tungsten-containing compound is tungsten hexafluoride and the preferred reductant is hydrogen.

Process Integration

A tungsten nucleation layer as described above has shown particular utility when integrated with traditional bulk fill techniques to form features with excellent film properties. An integration scheme can include ALD or pulsed-CVD processes to deposit a nucleation layer while a bulk layer may be deposited by CVD or PVD processes. Integrated processing systems capable of performing such an integration scheme include an Endura®, Endura SL®, Centura® and Producer® processing systems, each available from Applied Materials, Inc. located in Santa Clara, Calif. Any of these systems can be configured to include at least one ALD or pulsed-CVD chamber for depositing the nucleation layer and at least one CVD chamber or PVD chamber for bulk fill.

Figure 3A:
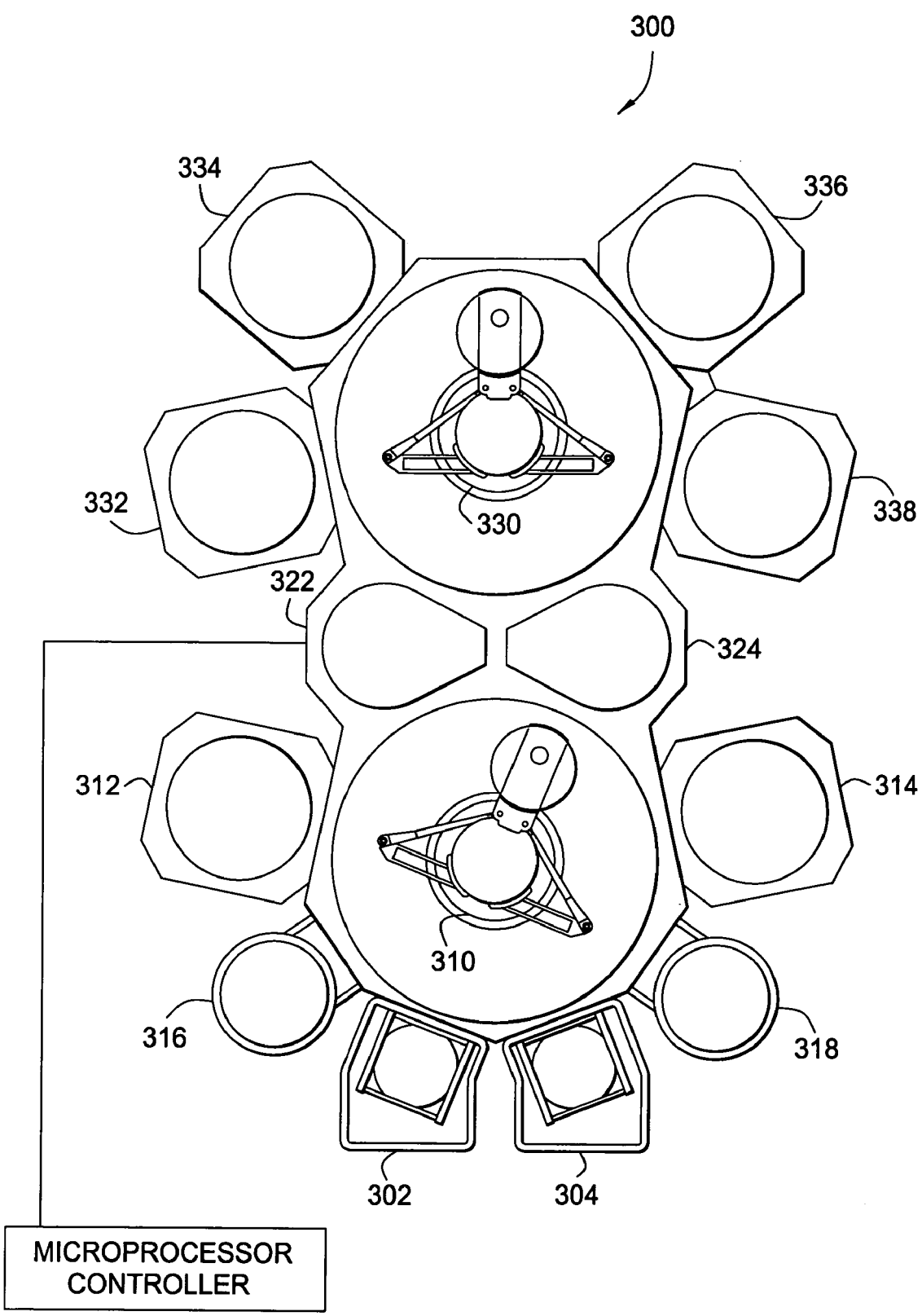
FIG. 3A shows an exemplary integrated processing platform.

FIG. 3A is a schematic top-view diagram of an exemplary multi-chamber processing system 300. A similar multi-chamber processing system is disclosed in commonly assigned U.S. Pat. No. 5,186,718, which is incorporated by reference herein. The system 300 generally includes load lock chambers 302, 304 for the transfer of substrates into and out from the system 300. Typically, since the system 300 is under vacuum, the load lock chambers 302, 304 may "pump down"

the substrates introduced into the system 300. A first robot 310 may transfer the substrates between the load lock chambers 302, 304, and a first set of one or more substrate processing chambers 312, 314, 316, 318 (four are shown). Each processing chamber 312, 314, 316, 318, can be outfitted to perform a number of substrate processing operations such as cyclical layer deposition, CVD, PVD, etch, pre-clean, de-gas, orientation and other substrate processes. The first robot 310 also transfers substrates to/from one or more transfer chambers 322, 324.

The transfer chambers 322, 324, are used to maintain ultra-high vacuum conditions while allowing substrates to be transferred within the system 300. A second robot 330 may transfer the substrates between the transfer chambers 322, 324 and a second set of one or more processing chambers 332, 334, 336, 338. Similar to processing chambers 312, 314, 316, 318, the processing chambers 332, 334, 336, 338 can be outfitted to perform a variety of substrate processing operations, such as cyclical deposition, CVD, PVD, etch, pre-clean, de-gas, and orientation, for example. Any of the substrate processing chambers 312, 314, 316, 318, 332, 334, 336, 338 may be removed from the system 300 if not necessary for a particular process to be performed by the system 300.

In one arrangement, each processing chamber 332 and 338 may be a cyclical deposition chamber adapted to deposit a nucleation layer; each processing chamber 334 and 336 may be a cyclical deposition chamber, a chemical vapor deposition chamber or a physical vapor deposition chamber adapted to form a bulk layer; each processing chamber 312 and 314 may be a physical vapor deposition chamber, a chemical vapor deposition chamber, or a cyclical deposition chamber adapted to deposit a dielectric layer; and each processing chamber 316 and 318 may be an etch chamber outfitted to etch apertures or openings for interconnect features. This one particular arrangement of the system 300 is provided to illustrate the invention and should not be used to limit the scope of the invention.

Another integrated system may include nucleation deposition as well as bulk fill deposition in a single chamber. A chamber configured to operate in both a cyclical deposition mode as well as a conventional CVD mode can be used. One example of such a chamber is described in commonly assigned U.S. Ser. No. 10/016,300, filed on Dec. 12, 2001, and issued as U.S. Pat. No. 6,878,206, which is incorporated herein by reference.

In another integration scheme, one or more cyclical deposition nucleation chambers are integrated onto a first processing system while one or more bulk layer deposition chambers are integrated onto a second processing system. In this configuration, substrates are first processed in the first system where a nucleation layer is deposited on a substrate. Thereafter, the substrates are moved to the second processing system where bulk deposition occurs.

Figure 3B:
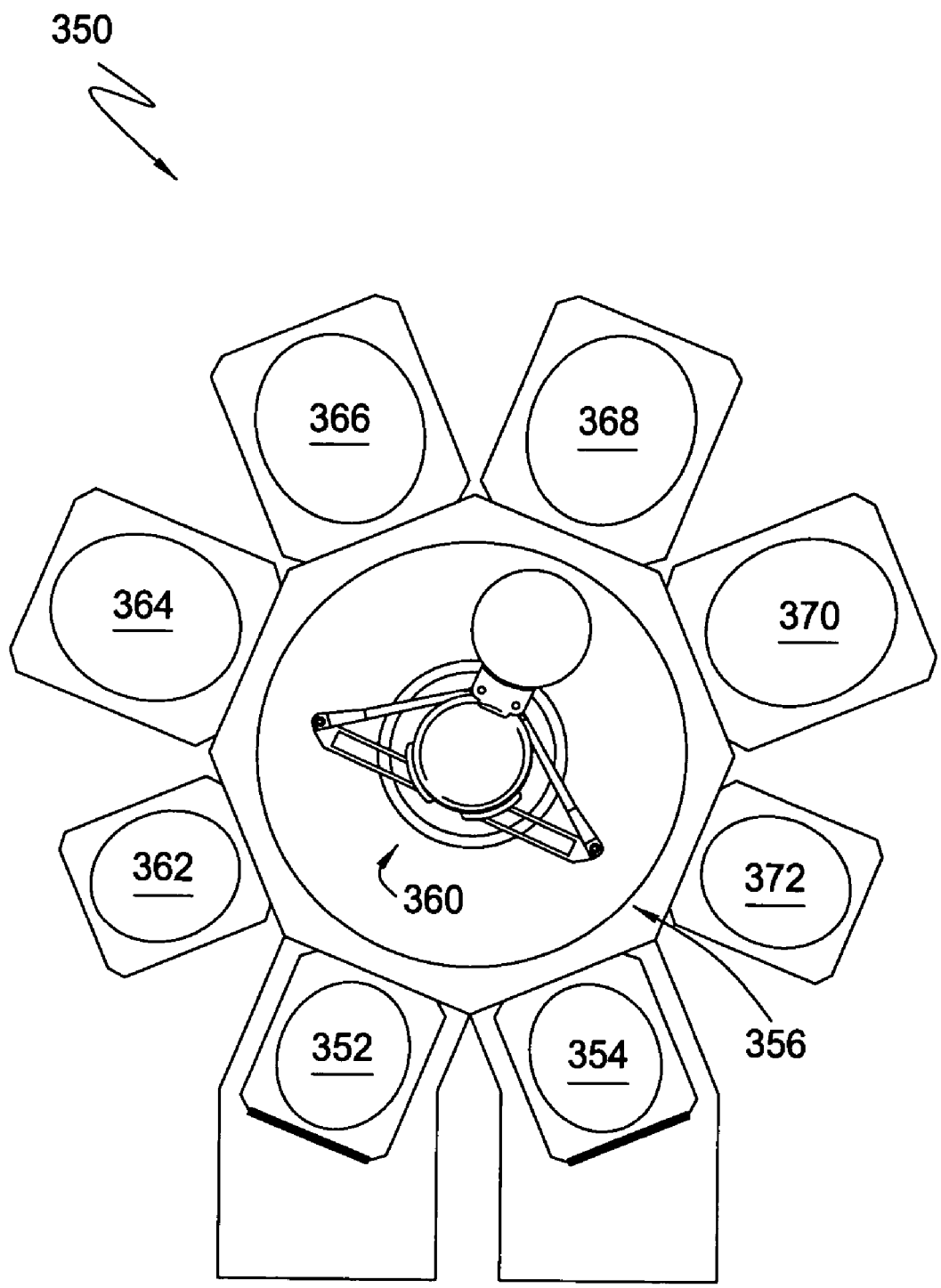
FIG. 3B shows another exemplary integrated processing platform.

FIG. 3B is a schematic top-view diagram of an exemplary multi-chamber processing system 350. The system 350 generally includes load lock chambers 352, 354 for the transfer of substrates into and out from the system 350. Typically, since the system 350 is under vacuum, the load lock chambers 352, 354 may "pump down" the substrates introduced into the system 350. A robot 360 may transfer the substrates between the load lock chambers 352, 354, and substrate processing chambers 362, 364, 366, 368, 370 and 372. Each processing chamber 362, 364, 366, 368, 370 and 372 can be outfitted to perform a number of substrate processing operations such as cyclical layer deposition, CVD, PVD, etch, pre-clean, de-gas, heat, orientation and other substrate processes. The robot 360 also transfers substrates to/from a transfer chamber 356. Any of the substrate processing chambers 362, 364, 366, 368, 370 and 372 may be removed from the system 350 if not necessary for a particular process to be performed by the system 350.

In one arrangement, each processing chamber 364 and 370 may be a cyclical deposition chamber adapted to deposit a nucleation layer; each processing chamber 366 and 368 may be a cyclical deposition chamber, a chemical vapor deposition chamber or a physical vapor deposition chamber adapted to form a bulk fill deposition layer. This one particular arrangement of the system 350 is provided to illustrate the invention and should not be used to limit the scope of the invention.

Alternatively, a carousel type batch processing system having a plurality of stations in a single chamber can be adapted to incorporate nucleation and bulk layer deposition into a single processing system. In such a processing system a purge gas curtain, such as an argon gas curtain, can be established between each station creating a micro or mini environment at each station. The substrates are loaded into the system sequentially and then rotated through each station and processed at least partially at each station. For example, a substrate may be exposed to a cyclical deposition nucleation step at a first station and then to partial bulk fill CVD steps at each of the subsequent stations. Alternatively, nucleation may occur at more than one station and bulk fill may occur at one or more stations. Still further, the nucleation layer and the bulk layer may be deposited in separate carousel type systems. In another aspect, the soak and the nucleation steps are completed in one carousel while the bulk steps are done on another carousel, wherein both carousels are part of the same process system. Each platen can be temperature controlled to provide at least some process control at each station. However, the process pressure typically remains the same between stations because the stations are housed in a single chamber. Some pressure control may be available in a micro or mini environment present at each station due to the inert gas curtain.

Regardless of the integration scheme, the nucleation layer is typically deposited to a thickness in a range from about 10 Å to about 200 Å and the bulk layer has a thickness in a range from about 100 Å to about 10,000 Å, preferably in the range from about 1,000 Å to about 5,000 Å. However, the thickness of these films can vary depending on the feature sizes and aspect ratios of a given application. Accordingly, the films are suitably sized to accommodate the geometries of a given application. The following are some exemplary geometries and applications that can benefit from a nucleation layer deposited according to embodiments described herein. The following descriptions are intended for illustrative purposes only, and are not intended to limit the uses of the present invention.

Figure 4A:
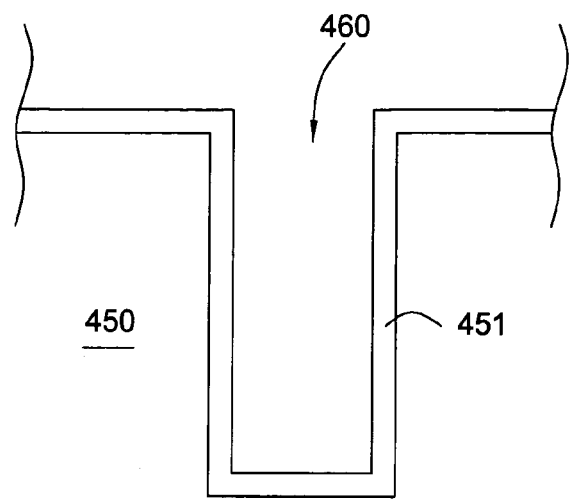
FIGS. 4A-C show cross sectional views of a via, a nucleated via and a filled via.
Figure 4B:
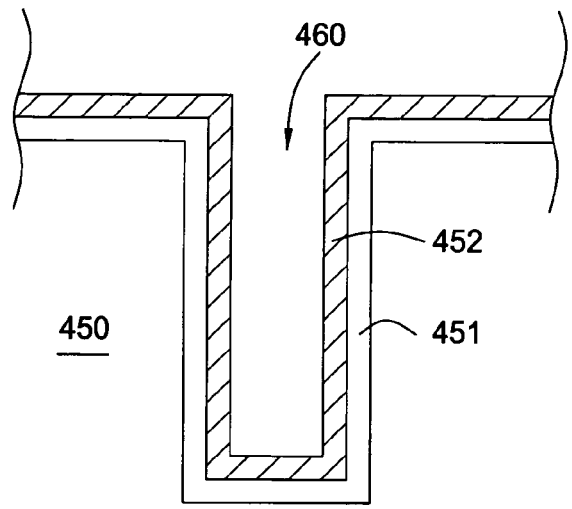
Figure 4C:
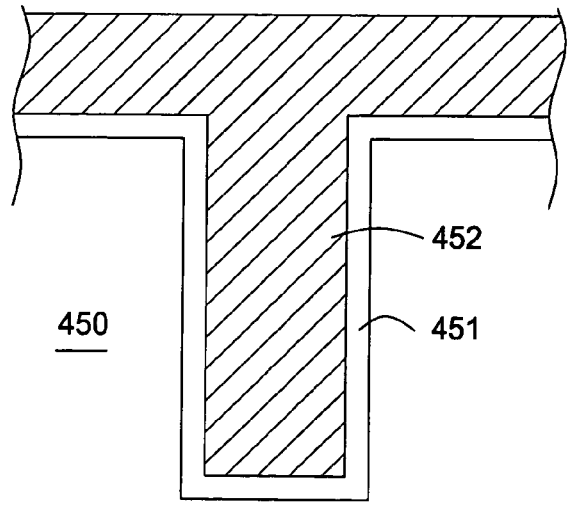

FIGS. 4A-C show cross sectional views of a semiconductor feature that one embodiment of the process is utilized to fill a via 460. In FIG. 4A, the substrate 450 includes at least one via 460. A barrier layer 451, such as titanium nitride, is deposited by ALD, CVD or PVD techniques to the substrate 450 with via 460. Prior to the nucleation of a tungsten layer 452, as depicted in FIG. 4B, a soak process is administered to barrier layer 451. The soak process renders the sidewalls, of the barrier layer 451 within the via 460, to adhere and grow the tungsten layer 452 at about the same rate as the barrier layer 451 outside the via 460. When the soak process is omitted, growth of tungsten layer 452 on the sidewalls is not constant with respect to the growth of tungsten layer 452 outside the via 460. Once the nucleation of tungsten layer 452 has been deposited, then a secondary soak or post soak process is conducted to treat tungsten layer 452. The post soak process provides tungsten layer 452 to more smoothly continue growth while filling the via 460, as demonstrated in FIG. 4C. In one example, an ALD process is continued after deposition of a tungsten nucleation layer to deposit the tungsten bulk layer. In another example, an ALD process is used to deposit the tungsten nucleation layer and a CVD process is used to deposit the tungsten bulk layer. In another example, an ALD process is used to deposit the tungsten nucleation layer and a PVD process is used to deposit the tungsten bulk layer. In another example, a pulsed-CVD process is used to deposit the tungsten nucleation layer and a conventional CVD process is used to deposit the tungsten bulk layer. In another example, a pulsed-CVD process is used to deposit the tungsten nucleation layer and a PVD process is used to deposit the tungsten bulk layer.

Tungsten Metal Gate

Figure 5:
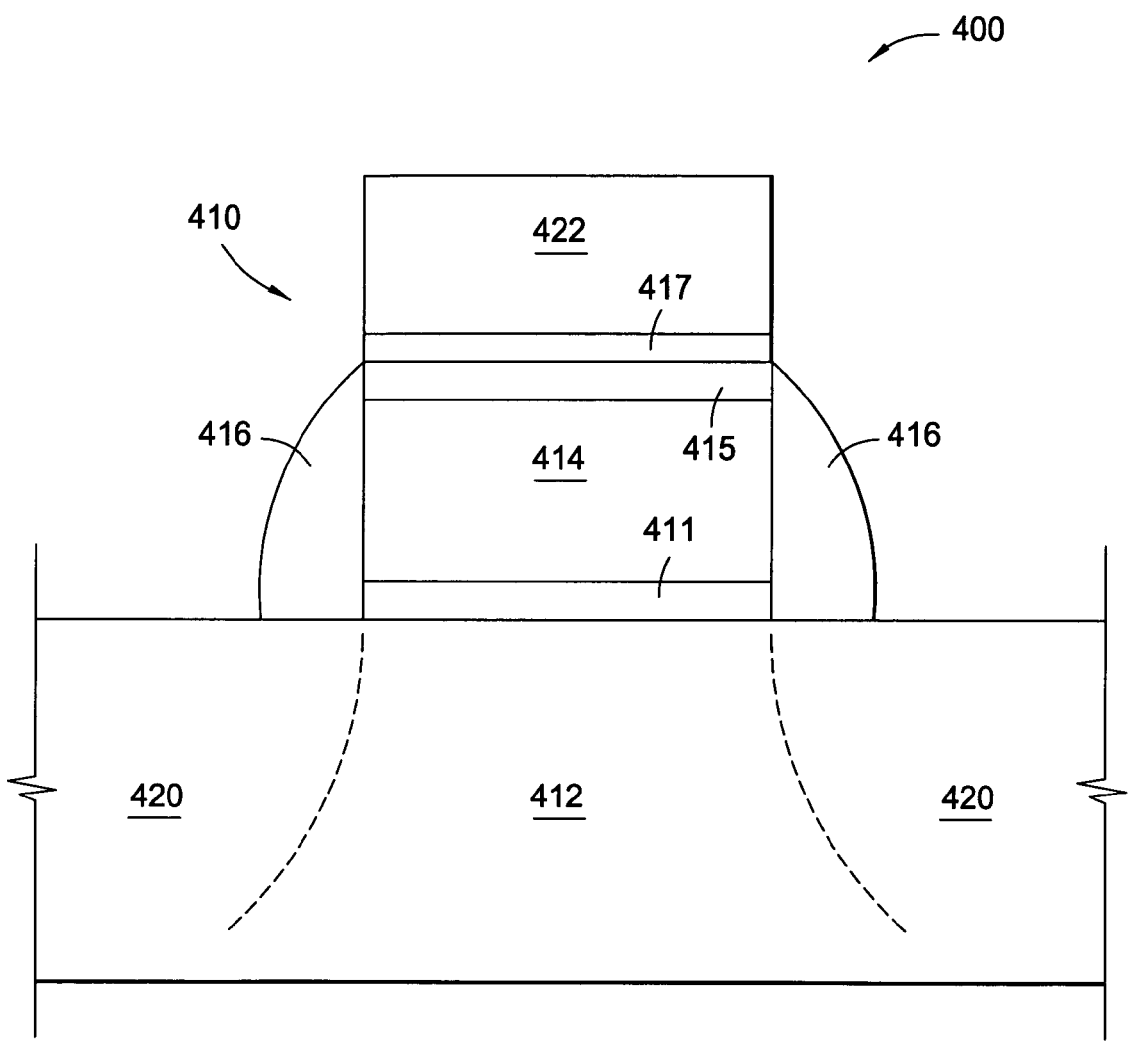
FIG. 5 shows a cross sectional view of an exemplary metal oxide gate device formed according to an embodiment of the invention.

FIG. 5 shows a cross sectional view of an exemplary metal oxide gate device 400 utilizing a nucleation layer deposited according to embodiments described herein. The device 400 generally includes an exposed gate 410 surrounded by spacers 416 and silicon source/drain areas 420 formed within a substrate surface 412. The spacers 416 typically include an oxide, such as silicon dioxide, or a nitride, such as silicon nitride.

The metal gate 410 includes an oxide layer 411, a polysilicon layer 414, a titanium nitride barrier layer 415 and a tungsten layer 422. The oxide layer 411 separates the substrate 412 from the polysilicon layer 414. The oxide layer 411 and the polysilicon layer 414 are deposited using conventional deposition techniques.

The titanium nitride barrier layer 415 is deposited on the polysilicon layer 414. The titanium nitride barrier layer 415 may be a bi-layer stack formed by depositing a PVD titanium layer followed by a CVD titanium nitride layer. The titanium nitride barrier layer 415 may also be deposited using a cyclical deposition technique, such as the process shown and described in commonly assigned U.S. Ser. No. 10/032,293, filed on Dec. 21, 2001, entitled "Chamber Hardware Design for Titanium Nitride Atomic Layer Deposition," published as U.S. Patent Publication 20030116087, which is incorporated by reference herein.

A soak process is administered to the substrate surface. The soak includes a silane compound or a borane compound along with at least one carrier gas. A preferred silane compound is silane, a preferred borane compound is diborane and a preferred carrier gas is either hydrogen, nitrogen and/or argon. In one aspect, silane has a flow rate in the range from about 25 sccm to about 500 sccm and hydrogen has a flow rate in the range from about 200 sccm to about 700 sccm. The soak process is conducted at a temperature in the range from about 100° C. to about 500° C., preferably at about 300° C., a pressure in the range from about 1 Torr to about 150 Torr, preferably from about 30 Torr to about 120 Torr and for a time period from about 1 second to about 90 seconds. In another aspect, diborane has a flow rate in the range from about 25 sccm to about 500 sccm and hydrogen and/or argon has a flow rate in the range from about 200 sccm to about 700 sccm. The soak process is conducted at a temperature in the range from about 100° C. to about 500° C., preferably at about 300° C., a pressure in the range from about 1 Torr to about 120 Torr, preferably at about 5 Torr to about 50 Torr, and a period of time from about 1 second to about 90 seconds, preferably less than about 60 seconds.

In one example, a nucleation layer 417 is then cyclically deposited over the barrier layer 415 following treatment of the substrate surface with a soak process. In one aspect, the nucleation layer 417 is cyclically deposited using alternating pulses of tungsten hexafluoride and diborane. The tungsten hexafluoride is pulsed at a rate of between about 1 sccm and about 100 sccm, such as between about 5 sccm and about 50 sccm, for about 0.3 seconds. A carrier gas, such as argon, is provided along with the tungsten hexafluoride at a rate of about 100 sccm to about 1,000 sccm, such as between about 100 sccm to about 500 sccm. The diborane is pulsed at a rate of about 50 sccm and about 1,000 sccm, such as between about 400 sccm and about 600 sccm, for about 0.3 seconds. A carrier gas, such as hydrogen, is provided along with the diborane at a rate between about 50 sccm to about 500 sccm, such as between about 100 sccm to about 300 sccm. The substrate is maintained at a temperature between about 100° C. and about 400° C., preferably at about 300° C., at a chamber pressure between about 1 Torr and about 120 Torr, preferably between about 5 Torr and about 50 Torr. In between pulses of the tungsten hexafluoride and the diborane, argon is pulsed for about 0.5 seconds to purge or otherwise remove any reactive compounds from the processing chamber.

In another aspect, the nucleation layer 417 is cyclically deposited using alternating pulses of tungsten hexafluoride and silane. The tungsten hexafluoride is pulsed as described above with argon for about 0.5 seconds. The silane is pulsed at a rate of about 1 sccm to about 100 sccm, such as between about 5 sccm to about 50 sccm, for about 0.5 seconds. A carrier gas, such as hydrogen, is provided along with the silane at a rate of about 100 sccm and about 1,000 sccm, such as between about 100 sccm and about 500 sccm. Argon is pulsed at a rate of about 100 sccm to about 1,000 sccm, such as between about 300 sccm to about 700 sccm, for about 0.5 seconds between the pulses of the tungsten hexafluoride and the pulses of silane. The substrate is maintained at a temperature between about 100° C. and about 400° C., preferably at about 300° C., at a chamber pressure between about 1 Torr and about 30 Torr.

In another example, a nucleation layer 417 is deposited by a pulsed-CVD process on the barrier layer 415 following treatment of the substrate surface with a soak process. The pulsed-CVD process includes co-flowing $WF_6$ and $B_2H_6$ or $WF_6$ and $SiH_4$ at a temperature in a range from about 300° C. to about 500° C., preferably from about 400° C. to about 450° C. The pulsed-CVD process pulses the co-flowing precursors at a time period from about 0.5 seconds to about 3 seconds, preferably about 1.5.

A second soak process or post soak process is administered to the substrate surface. The soak process includes a reductant, such as silane compound or a borane compound along with at least one carrier gas. Preferably, the reductant is diborane and a preferred carrier gas is hydrogen, nitrogen and/or argon. In one example, a reducing gas containing 5 vol % of diborane in argon has a flow rate in the range from about 100 sccm to about 500 sccm, preferably about 300 sccm. The soak process is conducted at a temperature in the range from about 100° C. to about 500° C., preferably about 300° C., a pressure in the range from about 1 Torr to about 120 Torr, preferably at about 10 Torr to about 50 Torr, and for a time period from about 1 second to about 90 seconds, preferably less than about 30 seconds.

A nucleation layer formed utilizing soak processes has advantages over a nucleation layer formed without the soak processes. The tungsten film shows less stress for the integrated film, as well as, less fluorine content at the interface of the nucleation layer. Also, the nucleation layer deposited post a soak treatment has higher uniformity coverage and is deposited quicker due to a reduced incubation period.

A tungsten bulk fill 422 is then deposited on the treated tungsten nucleation layer 417. Although any metal deposition process, such as conventional chemical vapor deposition or physical vapor deposition, may be used, the tungsten bulk fill 422 may be deposited by alternately adsorbing a tungsten-containing compound and a reducing compound as described above. A more detailed description of tungsten deposition using a cyclical deposition technique may be found in commonly assigned U.S. Ser. No. 10/016,300, filed on Dec. 12, 2001, and issued as U.S. Pat. No. 6,878,206 and in commonly assigned U.S. Ser. No. 10/082,048, filed on Feb. 20, 2002, and published as US 2003-0157760, which are both incorporated herein by reference. Fewer volcanoes appear on the surface of the tungsten film deposited utilizing a soak process, as compared to tungsten films deposited without exploiting a soak process, post tungsten bulk-fill.

Following deposition, the top portion of the resulting structure 400 may be planarized. A chemical mechanical polishing (CMP) apparatus may be used, such as the Mirra™ System available from Applied Materials, Santa Clara, Calif., for example. Portions of the tungsten bulk fill 422 are removed from the top of the structure leaving a fully planar surface. Optionally, the intermediate surfaces of the structure may be planarized between the depositions of the subsequent layers described above.

Figure 6:
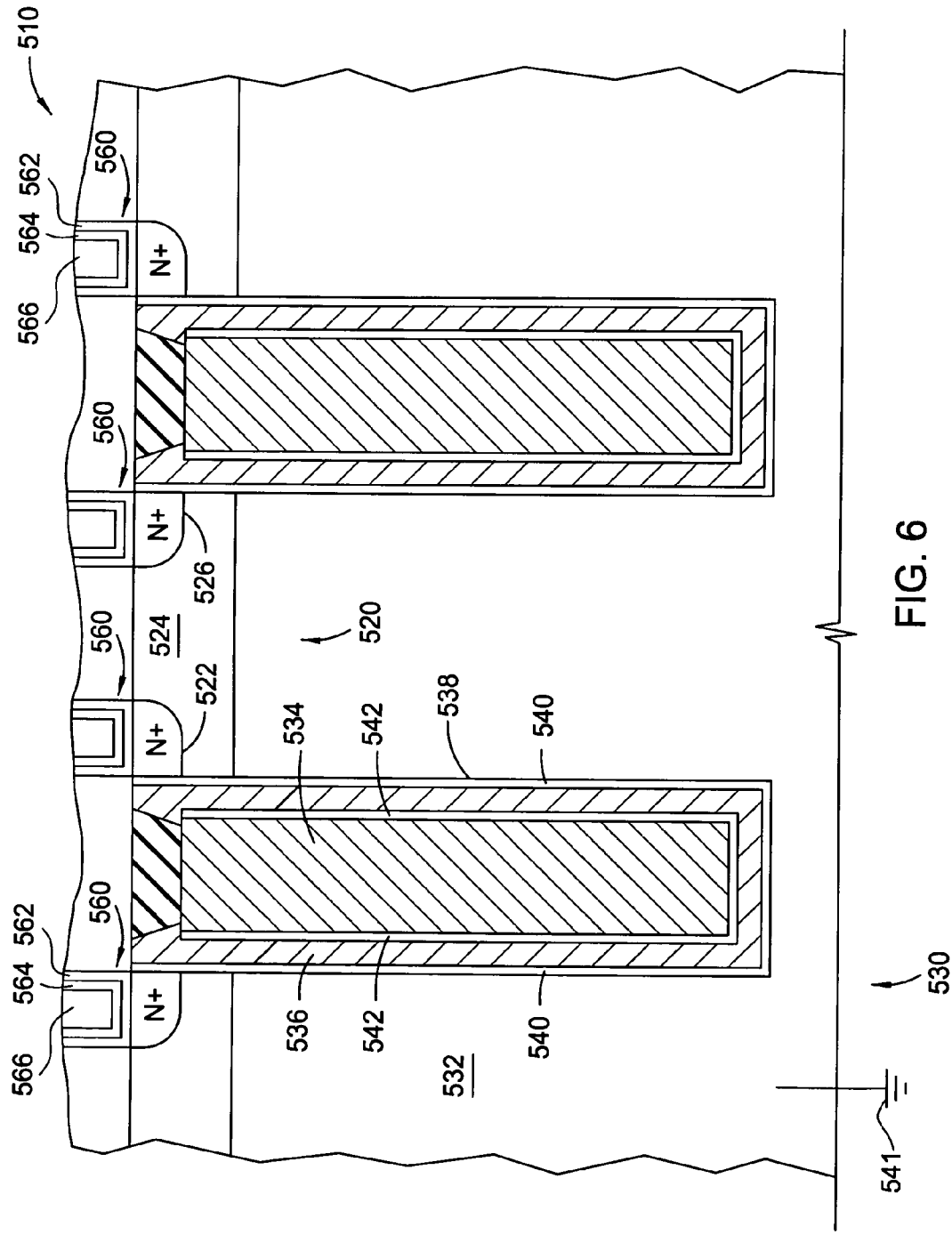
FIG. 6 shows a cross sectional view of a conventional DRAM device formed according to an embodiment of the invention.

FIG. 6 is a cross sectional view of a conventional DRAM device having a transistor 520 positioned adjacent a top portion of a trench capacitor 530. The access transistor 520 for the DRAM device 510 is positioned adjacent a top portion of the trench capacitor 530. Preferably, the access transistor 520 comprises an n-p-n transistor having a source region 522, a gate region 524 and a drain region 526. The gate region 524 is a P-doped silicon epi-layer disposed over the P+ substrate. The source region 522 of the access transistor 520 is an N+ doped material disposed on a first side of the gate region 524 and the drain region 526 is an N+ doped material disposed on a second side of the gate region 524, opposite the source region 522.

The source and drain regions 522, 524 may be connected to a tungsten plug 560. Each tungsten plug 560 includes a titanium liner 562, a tungsten nucleation layer 564, and a bulk tungsten fill 566. The titanium liner 562 may be a bi-layer stack comprising PVD titanium followed by CVD titanium nitride. Alternatively, the titanium liner 562 may be a bi-layer stack comprising ALD deposited titanium followed by ALD deposited titanium nitride. The tungsten nucleation layer 564 is formed by using a soak process and an ALD process or a soak process and a pulsed-CVD process as described above. The tungsten bulk fill 566 may be deposited using a post soak process and any conventional deposition techniques, including ALD, CVD and PVD.

The trench capacitor 530 generally includes a first electrode 532, a second electrode 534 and a dielectric material 536 disposed therebetween. The P+ substrate serves as a first electrode 532 of the trench capacitor 530 and is connected to a ground connection 541. A trench 538 is formed in the P+ substrate and filled with a heavily doped N+ polysilicon that serves as the second electrode 534 of the trench capacitor 530. The dielectric material 536 is disposed between the first electrode 532 (i.e., P+ substrate) and the second electrode 534 (i.e., N+ polysilicon).

The trench capacitor 530 also includes a first tungsten nitride barrier layer 540 disposed between the dielectric material 536 and the first electrode 532. Preferably, a second tungsten nitride barrier layer 542 is disposed between the dielectric material 536 and the second electrode 534. Alternatively, the barrier layers 540, 542 are a combination film, such as W/WN.

Although the above-described DRAM device utilizes an n-p-n transistor, a P+ substrate as a first electrode, and an N+ polysilicon as a second electrode of the capacitor, other transistor designs and electrode materials are contemplated by the present invention to form DRAM devices. Additionally, other devices, such as crown capacitors for example, are contemplated by the present invention.

EXAMPLES

The following examples were conducted to substrates that contained a barrier layer deposited on the surface. The barrier layer was formed by first depositing a titanium layer by a PVD process on a 300 mm substrate surface to a thickness of about 20 Å. Subsequently, a titanium nitride layer was deposited on the titanium layer using a CVD process of co-flowing PDMAT and ammonia. The tantalum nitride layer was deposited to a thickness of about 80 Å.

W-ALD Examples

Example 1

The substrate was placed into an ALD chamber and exposed to a soak process under the following conditions:
  Reagent: $B_2H_6$;
  Pressure: about 15 Torr;
  Temperature: about 300° C.;
  Flow rates: 300 sccm 5% $B_2H_6$ in Ar; and
  Duration: about 30 seconds.

Next, a tungsten nucleation layer was formed on the barrier layer in the same ALD chamber from the previous soak process using an ALD process under the following conditions:
  Reagents: $WF_6$ and $B_2H_6$;
  Pressure: about 5 Torr;
  Temperature: about 300° C.;
  Flow rates: pulse A: 20 sccm $WF_6$ and 300 sccm Ar;
    pulse B: 150 sccm $B_2H_6$ and 150 sccm $H_2$;
    Ar-purge: 500 sccm;
  Cycle duration: Ar-purge: 0.5 seconds;
    pulse A: 0.2 seconds;
    Ar-purge: 0.5 seconds; and
    pulse B: 0.2 seconds.

The cycle was repeated 4 times to form a nucleation layer with a thickness of about 12 Å. Thereafter, the substrate was maintained in the ALD chamber and exposed to a second soak process under the following conditions:
  Reagent: $B_2H_6$;
  Pressure: about 30 Torr;
  Temperature: about 300° C.;
  Flow rates: 300 sccm 5% $B_2H_6$ in Ar; and
  Duration: about 30 seconds.

Finally, the substrate was transferred into a CVD chamber and a bulk tungsten layer was deposited to a thickness of about 2,500 Å on the nucleation layer using a CVD process at about 400° C. The resulting tungsten bulk fill film exhibited a uniformity variance of less than about 2 percent.

Example 2

The substrate was placed into an ALD chamber and exposed to a soak process under the following conditions:
  Reagent: $B_2H_6$;
  Pressure: about 15 Torr;
  Temperature: about 300° C.;
  Flow rates: 300 sccm 5% $B_2H_6$ in Ar; and
  Duration: about 30 seconds.

Next, a tungsten nucleation layer was formed on the barrier layer in the same ALD chamber as used in the prior soak process using an ALD process under the following conditions:
Reagents: $WF_6$ and $SiH_4$;
Pressure: about 10 Torr;
Temperature: about 300° C.;
Flow rates: pulse A: 30 sccm $WF_6$ and 300 sccm Ar;
  pulse B: 20 sccm $SiH_4$ and 300 sccm $H_2$;
  Ar purge: 500 sccm;
Cycle duration: Ar-purge: 0.5 seconds;
  pulse A: 0.3 seconds;
  Ar-purge: 0.5 seconds; and
  pulse B: 0.3 seconds.

The cycle was repeated 4 times to form a nucleation layer with a thickness of about 30 Å. Thereafter, the substrate was transferred to a CVD chamber and exposed to a second soak process under the following conditions:
Reagent: $B_2H_6$;
Pressure: about 30 Torr;
Temperature: about 300° C.;
Flow rates: 300 sccm 5% $B_2H_6$ in Ar; and
Duration: about 30 seconds.

Finally, the substrate was maintained in the CVD chamber and a bulk tungsten layer was deposited to a thickness of about 2,500 Å on the nucleation layer using a CVD process at about 400° C. The resulting tungsten bulk fill film exhibited a uniformity variance of less than about 4 percent.

CVD Example

Example 3

The substrate was placed into a CVD chamber and exposed to a soak process under the following conditions:
Reagent: $B_2H_6$;
Pressure: about 90 Torr;
Temperature: about 400° C.;
Flow rates: 200 sccm 5% $B_2H_6$ in Ar; and
Duration: about 24 seconds.

Next, a tungsten nucleation layer was formed on the barrier layer in the CVD chamber from the previous soak process using a pulsed-CVD process under the following conditions:
Reagents: $WF_6$ and $SiH_4$;
Pressure: about 30 Torr;
Temperature: about 400° C.;
Flow rates: 60 sccm $WF_6$ and 30 sccm $SiH_4$;
Pulse duration: 1.5 seconds;

The pulsed-CVD process was continued until the nucleation layer had a thickness of about 50 Å. Thereafter, the substrate was kept in the CVD chamber and a second nucleation layer was deposited on the first nucleation layer. The second nucleation layer was deposited by a traditional CVD process to a thickness of about 200 Å under the following conditions:
Reagents: $WF_6$ and $SiH_4$;
Pressure: about 30 Torr;
Temperature: about 400° C.;
Flow rates: 60 sccm $WF_6$ and 30 sccm $SiH_4$.

Subsequently, a bulk tungsten layer was deposited to a thickness of about 2,500 Å on the second nucleation layer using a CVD process at about 400° C.

Example 4

The substrate was placed into a CVD chamber and exposed to a soak process under the following conditions:
Reagent: $B_2H_6$;
Pressure: about 90 Torr;
Temperature: about 400° C.;
Flow rates: 200 sccm 5% $B_2H_6$ in Ar; and
Duration: about 24 seconds.

Next, a tungsten nucleation layer was formed on the barrier layer in the previously used CVD chamber using a pulsed-CVD process under the following conditions:
Reagents: $WF_6$ and $B_2H_6$;
Pressure: about 30 Torr;
Temperature: about 400° C.;
Flow rates: 60 sccm $WF_6$ and 30 sccm $B_2H_6$;
Pulse duration: 1.5 seconds;

The pulsed-CVD process was continued until the nucleation layer had a thickness of about 50 Å. Thereafter, the substrate was kept in the CVD chamber and a second nucleation layer was deposited on the first nucleation layer. The second nucleation layer was deposited by a traditional CVD process to a thickness of about 200 Å under the following conditions:
Reagents: $WF_6$ and $B_2H_6$;
Pressure: about 30 Torr;
Temperature: about 400° C.;
Flow rates: 60 sccm $WF_6$ and 30 sccm $B_2H_6$.

Example 5

The substrate was placed into a CVD chamber and exposed to a soak process under the following conditions:
Reagent: $B_2H_6$;
Pressure: about 90 Torr;
Temperature: about 400° C.;
Flow rates: 200 sccm 5% $B_2H_6$ in Ar; and
Duration: about 24 seconds.

Next, a tungsten nucleation layer was formed on the barrier layer in the same CVD chamber used during the soak process using a pulsed-CVD process under the following conditions:
Reagents: $WF_6$ and $SiH_4$;
Pressure: about 30 Torr;
Temperature: about 400° C.;
Flow rates: 60 sccm $WF_6$ and 30 sccm $SiH_4$;
Pulse duration: 1.5 seconds;

The pulsed-CVD process was continued until the nucleation layer had a thickness of about 150 Å. Thereafter, the substrate was kept in the CVD chamber and exposed to a second soak process under the following conditions:
Reagent: $B_2H_6$;
Pressure: about 90 Torr;
Temperature: about 400° C.;
Flow rates: 300 sccm 5% $B_2H_6$ in Ar; and
Duration: about 30 seconds.

Finally, the substrate was maintained in the CVD chamber and a bulk tungsten layer was deposited to a thickness of about 2,500 Å on the nucleation layer using a CVD process at about 400° C. The resulting tungsten bulk fill film exhibited a uniformity variance of less than about 4 percent.

Example 6

The substrate was placed into a CVD chamber and exposed to a soak process under the following conditions:
Reagent: $B_2H_6$;
Pressure: about 90 Torr;
Temperature: about 400° C.;
Flow rates: 200 sccm 5% $B_2H_6$ in Ar; and
Duration: about 24 seconds.

Next, a tungsten nucleation layer was formed on the barrier layer in the CVD chamber used during the prior soak process using a pulsed-CVD process under the following conditions:
Reagents: $WF_6$ and $B_2H_6$;
Pressure: about 30 Torr;
Temperature: about 400° C.;

Flow rates: 60 sccm $WF_6$ and 30 sccm $B_2H_6$;
Pulse duration: 1.5 seconds;

The pulsed-CVD process was continued until the nucleation layer had a thickness of about 150 Å. Thereafter, the substrate was kept in the CVD chamber and exposed to a second soak process under the following conditions:
Reagent: $B_2H_6$;
Pressure: about 15 Torr;
Temperature: about 400° C.;
Flow rates: 200 sccm 5% $B_2H_6$ in Ar; and
Duration: about 10 seconds.

Finally, the substrate was maintained in the CVD chamber and a bulk tungsten layer was deposited to a thickness of about 2,500 Å on the nucleation layer using a CVD process at about 400° C. The resulting tungsten bulk fill film exhibited a uniformity variance of less than about 2 percent.

Example 7

The substrate was placed into a CVD chamber and exposed to a soak process under the following conditions:
Reagent: $B_2H_6$;
Pressure: about 15 Torr;
Temperature: about 400° C.;
Flow rates: 200 sccm 5% $B_2H_6$ in Ar; and
Duration: about 1 second.

Next, the soak process is stopped for 0.5 seconds, the chamber purged and then a tungsten nucleation layer was formed on the barrier layer in the CVD chamber used during the prior soak process using a pulsed-CVD process under the following conditions:
Reagents: $WF_6$ and $B_2H_6$;
Pressure: about 15 Torr;
Temperature: about 400° C.;
Flow rates: 60 sccm $WF_6$ and 30 sccm $B_2H_6$;
Pulse duration: 1.5 seconds;

The first nucleation process was stopped and the chamber purged for about 0.5 seconds. Then the soak process and the pulsed-CVD process were repeated in a cycle for three times to form a first nucleation layer with a thickness of about 50 Å. Thereafter, the substrate was kept in the CVD chamber and exposed to a traditional CVD process to form a second nucleation layer with a thickness of about 200 Å on the first nucleation layer under the following conditions:
Reagents: $WF_6$ and $B_2H_6$;
Pressure: about 30 Torr;
Temperature: about 400° C.;
Flow rates: 60 sccm $WF_6$ and 30 sccm $B_2H_6$;
Duration: 6 seconds;

Finally, the substrate was maintained in the CVD chamber and a bulk tungsten layer was deposited to a thickness of about 2,500 Å on the second nucleation layer using a CVD process under the following conditions:
Reagents: $WF_6$ and $H_2$;
Pressure: about 300 Torr;
Temperature: about 400° C.;
Flow rates: 400 sccm $WF_6$ and 4,000 sccm $H_2$;
Pulse duration: 30 seconds.

Example 8

The substrate was placed into a CVD chamber and exposed to a soak process under the following conditions:
Reagent: $SiH_4$;
Pressure: about 15 Torr;
Temperature: about 425° C.;
Flow rates: 30 sccm $SiH_4$; and
Duration: about 1 second.

Next, the soak process is stopped for 0.5 seconds, the chamber purged and then a tungsten nucleation layer was formed on the barrier layer in the CVD chamber used during the prior soak process using a pulsed-CVD process under the following conditions:
Reagents: $WF_6$ and $SiH_4$;
Pressure: about 15 Torr;
Temperature: about 425° C.;
Flow rates: 60 sccm $WF_6$ and 30 sccm $SiH_4$;
Pulse duration: 1.5 seconds;

The first nucleation process was stopped and the chamber purged for about 0.5 seconds. Then the soak process and the pulsed-CVD process were repeated in a cycle for three times to form a first nucleation layer with a thickness of about 50 Å. Thereafter, the substrate was kept in the CVD chamber and exposed to a traditional CVD process to form a second nucleation layer with a thickness of about 200 Å on the first nucleation layer under the following conditions:
Reagents: $WF_6$ and $SiH_4$;
Pressure: about 30 Torr;
Temperature: about 425° C.;
Flow rates: 60 sccm $WF_6$ and 30 sccm $SiH_4$;
Duration: 8 seconds;

Finally, the substrate was maintained in the CVD chamber and a bulk tungsten layer was deposited to a thickness of about 2,500 Å on the second nucleation layer using a CVD process under the following conditions:
Reagents: $WF_6$ and $H_2$;
Pressure: about 300 Torr;
Temperature: about 400° C.;
Flow rates: 400 sccm $WF_6$ and 4,000 sccm $H_2$;
Pulse duration: 30 seconds.

While the foregoing is directed to embodiments of the invention, other and further embodiments of the invention may be devised without departing from the basic scope thereof, and the scope thereof is determined by the claims that follow.

The invention claimed is:

1. A method for forming a tungsten-containing material on a substrate, comprising:
   positioning a substrate containing a barrier layer disposed thereon within a process chamber;
   exposing the substrate to a reducing gas to form a first reducing agent layer on the barrier layer during a first soak process;
   depositing a nucleation layer over the barrier layer by sequentially exposing the substrate to a tungsten-containing precursor and a reductant during an atomic layer deposition process;
   exposing the substrate to the reducing gas to form a second reducing agent layer on the nucleation layer during a second soak process; and
   depositing a bulk layer over the nucleation layer.

2. The method of claim 1, wherein the barrier layer comprises titanium or titanium nitride.

3. The method of claim 1, wherein the reducing gas comprises a reducing agent selected from the group consisting of hydrogen, silane, diborane, derivatives thereof, and combinations thereof.

4. The method of claim 3, wherein the tungsten-containing precursor comprises tungsten hexafluoride and the reductant comprises silane.

5. The method of claim 3, wherein the tungsten-containing precursor comprises tungsten hexafluoride and the reductant comprises diborane.

6. The method of claim 5, wherein the nucleation layer has a thickness of about 200 Å or less.

7. The method of claim 1, wherein the bulk layer is deposited by a chemical vapor deposition process.

8. The method of claim 1, wherein the barrier layer comprises tungsten nitride.

9. The method of claim 8, wherein the barrier layer comprises a tungsten nitride-containing layer disposed over a tungsten layer.

10. The method of claim 8, wherein the barrier layer comprises a combination film of tungsten and tungsten nitride.

11. The method of claim 1, wherein the reducing gas comprises diborane.

12. A method for forming a tungsten-containing material on a substrate, comprising:
   positioning a substrate within a process chamber;
   exposing the substrate to a reducing gas to form a first reducing agent layer on the substrate during a pre-soak process;
   depositing a nucleation layer over the substrate by sequentially exposing the substrate to a tungsten-containing precursor and a reductant during an atomic layer deposition process;
   exposing the substrate to the reducing gas to form a second reducing agent layer on the nucleation layer during a second soak process; and
   depositing a bulk layer over the second reducing agent layer.

13. The method of claim 12, wherein the substrate comprises a barrier layer and the barrier layer comprises titanium or titanium nitride.

14. The method of claim 12, wherein the reducing gas comprises a reducing agent selected from the group consisting of hydrogen, silane, diborane, derivatives thereof, and combinations thereof.

15. The method of claim 12, wherein the tungsten-containing precursor comprises tungsten hexafluoride and the reductant comprises silane.

16. The method of claim 12, wherein the tungsten-containing precursor comprises tungsten hexafluoride and the reductant comprises diborane.

17. The method of claim 12, wherein the nucleation layer has a thickness of about 200 Å or less.

18. The method of claim 12, wherein the bulk layer is deposited by a chemical vapor deposition process.

19. The method of claim 12, wherein the substrate comprises a barrier layer comprising tungsten nitride.

20. The method of claim 19, wherein the barrier layer comprises a tungsten nitride-containing layer disposed over a tungsten layer.

21. The method of claim 19, wherein the barrier layer comprises a combination film of tungsten and tungsten nitride.

22. The method of claim 12, wherein the reducing gas comprises diborane.

23. A method for forming a tungsten-containing material on a substrate, comprising:
   positioning a substrate containing a barrier layer disposed thereon within a process chamber;
   exposing the substrate to a reducing gas during a first soak process;
   depositing a nucleation layer over the barrier layer by a pulsed chemical vapor deposition process or an atomic layer deposition process;
   exposing the nucleation layer to the reducing gas during a second soak process; and
   depositing a bulk layer over the nucleation layer by a chemical vapor deposition process.

24. The method of claim 23, wherein the barrier layer comprises tungsten nitride.

25. The method of claim 24, wherein the barrier layer comprises a tungsten nitride-containing layer disposed over a tungsten layer.

26. The method of claim 24, wherein the barrier layer comprises a combination film of tungsten and tungsten nitride.

27. A method for forming a tungsten-containing material on a substrate, comprising:
   positioning a substrate containing a barrier layer disposed thereon within a process chamber, wherein the barrier layer comprises tungsten;
   exposing the substrate to a reducing gas during a first soak process;
   depositing a first nucleation layer over the barrier layer by flowing a tungsten-containing precursor and a reductant into the process chamber;
   depositing a second nucleation layer over the first nucleation layer;
   depositing a bulk layer over the second nucleation layer; and
   exposing the first nucleation layer or the second nucleation layer to the reducing gas to form a reducing agent layer during a second soak process.

28. The method of claim 27, wherein the reducing gas comprises diborane.

29. A method for forming a tungsten-containing material on a substrate, comprising:
   positioning a substrate containing a barrier layer disposed thereon within a process chamber, wherein the barrier layer comprises a combination film of tungsten and tungsten nitride;
   exposing the substrate to a reducing gas to form a first reducing agent layer on the barrier layer during a first soak process; and
   depositing a nucleation layer over the barrier layer by sequentially exposing the substrate to a tungsten-containing precursor and a reagent during an atomic layer deposition process; and
   exposing the substrate to the reducing gas to form a second reducing agent layer on the nucleation layer during a second soak process.

* * * * *

UNITED STATES PATENT AND TRADEMARK OFFICE
CERTIFICATE OF CORRECTION

PATENT NO. : 7,405,158 B2
APPLICATION NO. : 11/038592
DATED : July 29, 2008
INVENTOR(S) : Lai et al.

It is certified that error appears in the above-identified patent and that said Letters Patent is hereby corrected as shown below:

Page 3 In the References Cited (56):

Line 18 please delete "2002/0144855 A1 10/2002 Chiang et al." and insert --2002/0144655 A1 10/2002 Chiang et al.-- therefor;

Line 42 please delete "2003/0164421 A1 9/2003 Collet et al." and insert --2002/0164421 A1 11/2002 Chiang et al.-- therefor;

Line 43 please delete "2003/0164423 A1 9/2003 Courtois et al." and insert --2002/0164423 A1 11/2002 Chiang et al.-- therefor;

Line 44 please delete "2003/0182320 A1 9/2003 Lai et al." and insert --2002/0182320 A1 12/2002 Leskela et al.-- therefor;

Line 48 please delete "2003/0187256 A1 10/2003 Berryman et al." and insert --2002/0187256 A1 12/2002 Elers et al.-- therefor.

Line 49 please delete "2003/0187631 A1 10/2003 Masushige et al." and insert --2002/0187631 A1 12/2002 Kim et al.-- therefor;

Line 57 please delete "2003/0197402 A1 10/2003 McCutcheon et al." and insert --2002/0197402 A1 12/2002 Chiang et al.-- therefor;

Line 58 please delete "2003/0197863 A1 10/2003 Snelling et al." and insert --2002/0197863 A1 12/2002 Mak et al.-- therefor;

UNITED STATES PATENT AND TRADEMARK OFFICE
CERTIFICATE OF CORRECTION

PATENT NO.       : 7,405,158 B2
APPLICATION NO.  : 11/038592
DATED            : July 29, 2008
INVENTOR(S)      : Lai et al.

It is certified that error appears in the above-identified patent and that said Letters Patent is hereby corrected as shown below:

Column 6, Line 45, please delete "scorn" and insert --sccm-- therefor;

Column 6, Line 46, please delete "scorn" and insert --sccm-- therefor.

Signed and Sealed this

Twentieth Day of January, 2009

JON W. DUDAS
*Director of the United States Patent and Trademark Office*